(12) United States Patent
Otsuki et al.

(10) Patent No.: US 12,217,943 B2
(45) Date of Patent: Feb. 4, 2025

(54) SUBSTRATE PROCESSING APPARATUS AND ELECTROSTATIC CHUCK

(71) Applicant: Tokyo Electron Limited, Tokyo (JP)

(72) Inventors: Kohei Otsuki, Miyagi (JP); Shin Yamaguchi, Miyagi (JP); Daisuke Satake, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 174 days.

(21) Appl. No.: 17/846,033

(22) Filed: Jun. 22, 2022

(65) Prior Publication Data
US 2022/0406576 A1  Dec. 22, 2022

(30) Foreign Application Priority Data

Jun. 22, 2021  (JP) .................................. 2021-103011
May 24, 2022  (JP) .................................. 2022-084767

(51) Int. Cl.
*H01J 37/32*    (2006.01)
*H01L 21/683*   (2006.01)

(52) U.S. Cl.
CPC .. *H01J 37/32724* (2013.01); *H01J 37/32449* (2013.01); *H01J 37/32513* (2013.01); *H01J 37/32816* (2013.01); *H01L 21/6833* (2013.01)

(58) Field of Classification Search
CPC ........... H01J 37/32724; H01J 37/32449; H01J 37/32513; H01J 37/32816; H01J 37/32715; H01L 21/6833; H01L 21/67017; H01L 21/67109; H01L 21/6831; H01L 21/6875; H01L 21/67069; C23C 16/4583; C23C 16/46

USPC .......................................................... 361/234
See application file for complete search history.

(56) References Cited

U.S. PATENT DOCUMENTS

2005/0018376 A1* 1/2005 Park .................... H01L 21/6831
                                                              361/234
2021/0013063 A1* 1/2021 Tamura ............. H01L 21/68785

FOREIGN PATENT DOCUMENTS

| JP | 2005203426 A | * | 7/2005 |
| JP | 2006-257495 A | | 9/2006 |
| JP | 2011155170 A | * | 8/2011 |
| JP | 2016143760 A | * | 8/2016 |
| JP | 2020-512692 A | | 4/2020 |
| JP | 2020-518125 A | | 6/2020 |

(Continued)

*Primary Examiner* — Thienvu V Tran
*Assistant Examiner* — Sreeya Sreevatsa
(74) *Attorney, Agent, or Firm* — XSENSUS LLP

(57) ABSTRACT

A substrate processing apparatus is provided. The apparatus comprises a chamber; a substrate support which is arranged in the chamber and has at least one first gas supply path; and at least one control valve configured to control a flow rate or pressure of gas supplied through the at least one first gas supply path. The substrate support includes a base, and an electrostatic chuck which is arranged on the base and has an upper surface. The upper surface has a plurality of protrusions and a first annular groove group. The first annular groove group comprises a first inner annular groove, a first intermediate annular groove, and a first outer annular groove. Any one of the first inner annular groove, the first intermediate annular groove, and the first outer annular groove communicates with the at least one first gas supply path.

14 Claims, 27 Drawing Sheets

(56) References Cited

FOREIGN PATENT DOCUMENTS

| JP | 2020-102614 A | 7/2020 |
| WO | 2018/183557 A1 | 10/2018 |

\* cited by examiner

SUBSTRATE PROCESSING APPARATUS AND ELECTROSTATIC CHUCK

CROSS-REFERENCE TO RELATED APPLICATIONS

This application claims priority to Japanese Patent Application Nos. 2021-103011 and 2022-084767, respectively filed on Jun. 22, 2021 and May 24, 2022, the entire contents of each are incorporated herein by reference.

TECHNICAL FIELD

The present disclosure relates to a substrate processing apparatus and an electrostatic chuck.

BACKGROUND

Japanese Patent Application Publication No. 2020-512692 discloses that an electrostatic chuck is provided with a plurality of sealing bands positioned on a surface of the chuck. The plurality of sealing bands come into contact with a substrate to form a seal between adjacent cooling zones.

Japanese Laid-open Patent Publication No. 2006-257495 discloses that, on a substrate holding face of an electrostatic chuck, an outer circumferential ring that surrounds the outermost circumference in an annular shape is provided. The outer circumferential ring comes into contact with a substrate when the substrate is mounted on the substrate holding face.

SUMMARY

The technique according to the present disclosure appropriately controls the temperature of a substrate to improve the uniformity of plasma processing in a substrate plane.

To this end, a substrate processing apparatus is provided, comprising: a chamber; a substrate support which is arranged in the chamber and has at least one first gas supply path; and at least one control valve configured to control a flow rate or pressure of gas supplied through the at least one first gas supply path, wherein: the substrate support includes a base, and an electrostatic chuck which is arranged on the base and has an upper surface; the upper surface has a plurality of protrusions and a first annular groove group; the first annular groove group comprises a first inner annular groove, a first intermediate annular groove, and a first outer annular groove; and any one of the first inner annular groove, the first intermediate annular groove, and the first outer annular groove communicates with the at least one first gas supply path.

DETAILED DESCRIPTION

Figure 1:
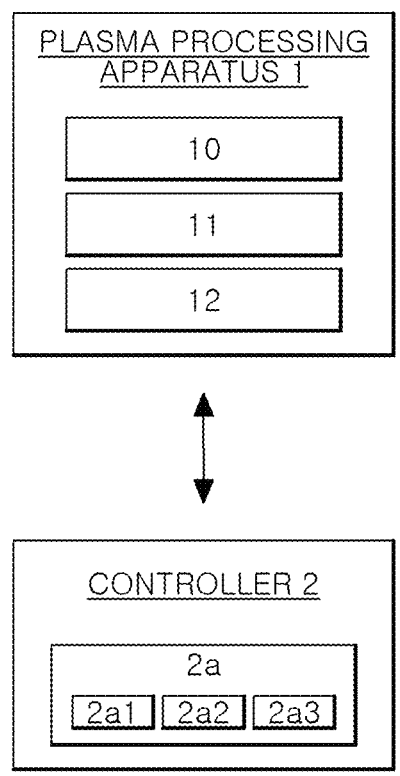
FIG. 1 is an explanatory view schematically illustrating the configuration of a plasma processing system.

In the process of manufacturing a semiconductor device, for example, a semiconductor substrate (hereinafter, referred to as "substrate") is subjected to plasma processing in a plasma processing apparatus. In the plasma processing apparatus, plasma is generated by exciting processing gas inside a chamber, and the substrate supported by an electrostatic chuck is processed by the plasma.

In plasma processing, in order to improve the intra-surface uniformity of plasma processing with respect to the substrate, it is required to appropriately control the temperature of the substrate being processed. Accordingly, for example, the temperature of the substrate is controlled by supplying heat transfer gas, such as helium gas, to the space between the back surface of the substrate and the surface of the electrostatic chuck, and controlling the pressure of the heat transfer gas.

Further, in recent years, in order to cope with further high precision of the temperature control of the substrate, the space between the back surface of the substrate and the surface of the electrostatic chuck is divided into a plurality of regions, and heat transfer gas is provided with different pressures depending on the regions, such that the temperature of the substrate is controlled for each region. Conventionally, in order to control the pressure of the heat transfer gas for each region, for example, the surface of the electrostatic chuck is provided with a so-called seal band, which is a partition that directly contacts the back surface of the substrate. For example, Japanese Patent Application Publication No. 2020-512692 described above discloses a configuration in which a plurality of sealing bands are provided as seal bands on a surface of the electrostatic chuck. Further, Japanese Laid-open Patent Publication No. 2006-257495 described above discloses that an inner circumferential ring may be provided on a surface of the electrostatic chuck, inside an outer circumferential ring on the outermost circumference.

However, since the seal band comes into direct contact with the back surface of the substrate, the contact portion becomes a local temperature singularity point. Specifically, heat transfer occurs to the substrate at the contact portion, and the temperature of the substrate at the contact portion is lowered. The temperature singularity point of the substrate affects the rate of plasma processing, and as a result, plasma processing may not be performed uniformly in a substrate plane. Accordingly, there is room for improvement in the conventional plasma processing.

The technique according to the present disclosure has been made in view of the above circumstances, and appropriately controls the temperature of the substrate to thereby improve the uniformity of plasma processing in the substrate plane. Hereinafter, the plasma processing apparatus and the electrostatic chuck according to the present embodiment will be described with reference to the drawings. In addition, in the present specification and the drawings, elements having substantially the same functional configuration are denoted by the same reference numerals, so that overlapping descriptions will be omitted.

<Plasma Processing System>

First, a plasma processing system according to one embodiment will be described with reference to FIG. 1. FIG. 1 is an explanatory view schematically illustrating the configuration of a plasma processing system.

In one embodiment, the plasma processing system includes a plasma processing apparatus 1 and a controller 2 as substrate processing apparatus. The plasma processing apparatus 1 includes a plasma processing chamber 10 as a chamber, a substrate support 11, and a plasma generation portion 12. The plasma processing chamber 10 has a plasma processing space. Further, the plasma processing chamber 10 has at least one gas supply port for supplying at least one processing gas to the plasma processing space, and at least one gas discharge port for discharging gas from the plasma processing space. The gas supply port is connected to a gas supply portion 20, which will be described later, and the gas discharge port is connected to an exhaust system 40, which will be described later. The substrate support 11 is arranged in the plasma processing space and has a substrate support surface for supporting the substrate.

The plasma generation portion 12 is configured to generate plasma from at least one processing gas supplied into the plasma processing space. Plasma formed in the plasma processing space may be capacitively coupled plasma (CCP), inductively coupled plasma (ICP), electron cyclotron resonance (ECR) plasma, helicon wave excited plasma (HWP: Helicon Wave Plasma), or surface wave plasma (SWP). In addition, various types of plasma generation portions may be used, including an alternating current (AC) plasma generation portion and a direct current (DC) plasma generation portion. In one embodiment, an AC signal (AC power) used in the AC plasma generation portion has a frequency within the range of 100 kHz to 10 GHz. Accordingly, the AC signal includes a radio frequency (RF) signal and a microwave signal. In one embodiment, the RF signal has a frequency in the range of 200 kHz to 150 MHz.

The controller 2 processes computer-executable instructions for causing the plasma processing apparatus 1 to execute various processes described in the present disclosure. The controller 2 may be configured to control each component of the plasma processing apparatus 1 to execute various processes described herein. In one embodiment, a part or all of the controller 2 may be included in the plasma processing apparatus 1. The controller 2 may include, for example, a computer 2a. The computer 2a may include, for example, a processor (CPU: Central Processing Unit) 2a1, a memory portion 2a2, and a communication interface 2a3. The processor 2a1 may be configured to execute various control operations based on the program stored in the memory portion 2a2. The memory portion 2a2 may include a random access memory (RAM), a read only memory (ROM), a hard disk drive (HDD), a solid state drive (SSD), or a combination thereof. The communication interface 2a3 may communicate with the plasma processing apparatus 1 via a communication line, such as a local area network (LAN).

<Plasma Processing Apparatus>

Figure 2:
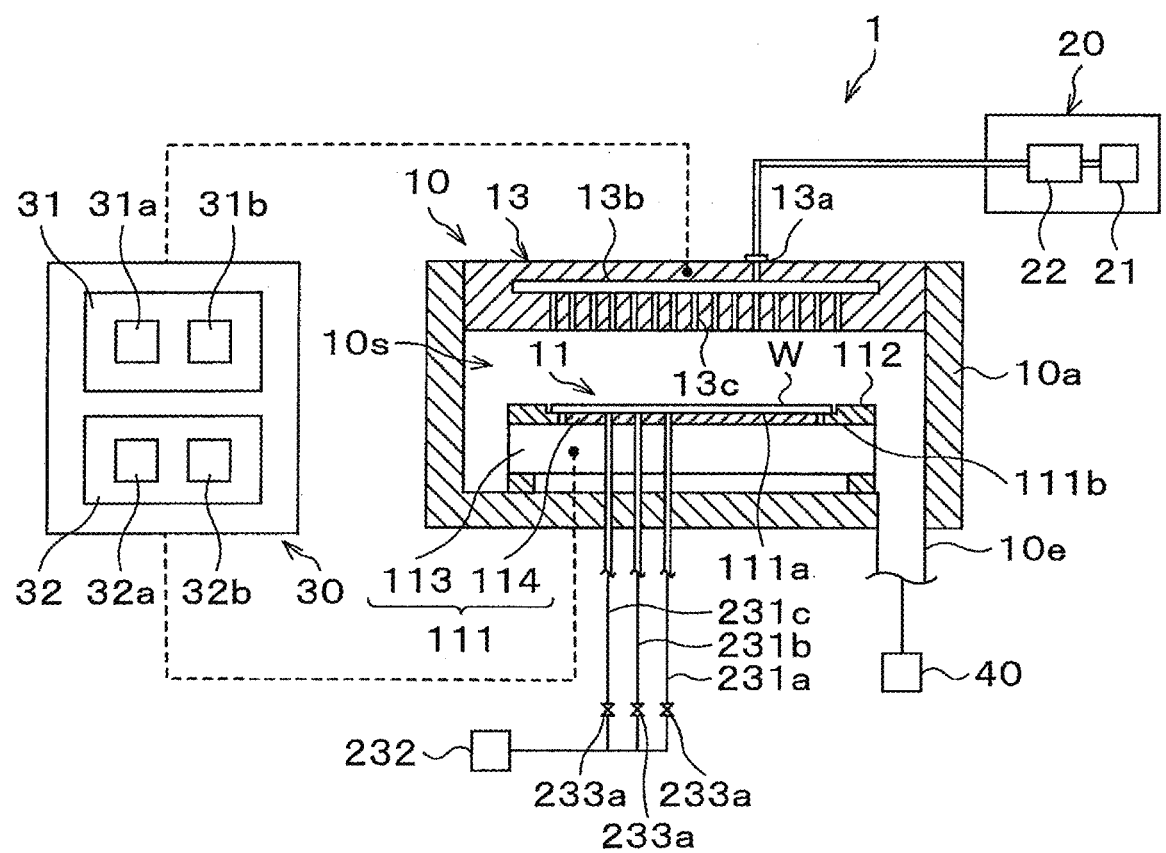
FIG. 2 is a longitudinal sectional view schematically illustrating the configuration of a plasma processing apparatus.

Hereinafter, a configuration example of a capacitively coupled plasma processing apparatus as an example of the plasma processing apparatus 1 will be described with reference to FIG. 2. FIG. 2 is a longitudinal sectional view schematically illustrating the configuration of the plasma processing apparatus 1. In the plasma processing apparatus 1 of the present embodiment, a substrate (wafer) W is subjected to plasma processing, but the substrate W to be plasma-processed is not limited to the wafer.

The capacitively coupled plasma processing apparatus 1 includes the plasma processing chamber 10, the gas supply portion 20, a power supply 30, and the exhaust system 40. Further, the plasma processing apparatus 1 includes the substrate support 11 and a gas introduction portion. The gas introduction portion is configured to introduce at least one processing gas into the plasma processing chamber 10. The gas introduction portion includes a shower head 13. The substrate support 11 is arranged in the plasma processing chamber 10. The shower head 13 is arranged above the substrate support 11. In one embodiment, the shower head 13 constitutes at least a portion of the ceiling portion of the plasma processing chamber 10. The plasma processing chamber 10 has a plasma processing space 10s defined by the shower head 13, a side wall 10a of the plasma processing chamber 10, and the substrate support 11. The side wall 10a is grounded. The shower head 13 and the substrate support 11 are electrically insulated from the housing of the plasma processing chamber 10.

The substrate support 11 includes a support body portion 111 and a ring assembly 112. The upper surface of the support body portion 111 has a substrate support surface 111a which is a central region for supporting the substrate W and a ring support surface 111b which is an annular region for supporting the ring assembly 112. The ring support surface 111b of the support body portion 111 surrounds the substrate support surface 111a of the support body portion 111 in a plan view. The substrate W is arranged on the substrate support surface 111a of the support body portion 111, and the ring assembly 112 is arranged on the ring support surface 111b of the support body portion 111 so as to surround the substrate W on the substrate support surface 111a of the support body portion 111.

In one embodiment, the support body portion 111 includes a base 113 and an electrostatic chuck 114. The base 113 includes a conductive member. The conductive member of the base 113 functions as a lower electrode. The electrostatic chuck 114 is arranged on the upper surface of the base 113.

The upper surface of the electrostatic chuck 114 has the substrate support surface 111a. In addition, in one embodiment, the upper surface of the electrostatic chuck 114 may have the ring support surface 111b. The configuration of the electrostatic chuck 114 will be described later. The ring assembly 112 includes one or more annular members. At least one of the one or more annular members is an edge ring.

Further, although not shown, the substrate support 11 may include a temperature control module configured to control at least one of the electrostatic chuck 114, the ring assembly 112, and the substrate W to a target temperature. The temperature control module may include a heater, a heat transfer medium, a flow path, or a combination thereof. For example, a flow path may be formed in the base 113, and a heater may be provided in the electrostatic chuck 114. Heat transfer fluid, such as brine or gas, flows through the flow path.

The shower head 13 is configured to introduce at least one processing gas from the gas supply portion 20 into the plasma processing space 10s. The shower head 13 has at least one gas supply port 13a, at least one gas diffusion chamber 13b, and a plurality of gas introduction ports 13c. The processing gas supplied to the gas supply port 13a passes through the gas diffusion chamber 13b and is introduced into the plasma processing space 10s from the plurality of gas introduction ports 13c. Further, the shower head 13 includes a conductive member. The conductive member of the shower head 13 functions as an upper electrode. In addition to the shower head 13, the gas introduction portion may include one or a plurality of side gas injectors (SGI) attached to one or a plurality of openings formed in the side wall 10a.

The gas supply portion 20 may include at least one gas source 21 and at least one flow rate controller 22. In one embodiment, the gas supply portion 20 is configured to supply at least one processing gas from the corresponding gas source 21 to the shower head 13 via the corresponding flow rate controller 22. Each flow rate controller 22 may include, for example, a mass flow controller or a pressure-controlled flow rate controller. Further, the gas supply portion 20 may include at least one flow rate modulation device that modulates the flow rate of at least one processing gas or causes it to pulsate.

The power supply 30 includes an RF power supply 31 coupled to the plasma processing chamber 10 via at least one impedance matching circuit. The RF power supply 31 is configured to supply at least one RF signal (RF power), such as a source RF signal and a bias RF signal, to the conductive member of the substrate support 11 and/or the conductive member of the shower head 13. As a result, plasma is formed from at least one processing gas supplied into the plasma processing space 10s. Accordingly, the RF power supply 31 may function as at least a part of the plasma generation portion 12. Further, by supplying the bias RF signal to the conductive member of the substrate support 11, a bias potential is generated in the substrate W, and an ionic component in the formed plasma may be inserted into the substrate W.

In one embodiment, the RF power supply 31 includes a first RF generation portion 31a and a second RF generation portion 31b. The first RF generation portion 31a is coupled to the conductive member of the substrate support 11 and/or the conductive member of the shower head 13 via at least one impedance matching circuit, and is configured to generate a source RF signal (source RF power) for plasma generation. In one embodiment, the source RF signal has a frequency in the range of 13 MHz to 150 MHz. In one embodiment, the first RF generation portion 31a may be configured to generate a plurality of source RF signals with different frequencies. The generated one or a plurality of source RF signals are supplied to the conductive member of the substrate support 11 and/or the conductive member of the shower head 13. The second RF generation portion 31b is coupled to the conductive member of the substrate support 11 via at least one impedance matching circuit, and is configured to generate a bias RF signal (bias RF power). In one embodiment, the bias RF signal has a lower frequency than the source RF signal. In one embodiment, the bias RF signal has a frequency in the range of 400 kHz to 13.56 MHz. In one embodiment, the second RF generation portion 31b may be configured to generate a plurality of bias RF signals with different frequencies. The generated one or a plurality of bias RF signals are supplied to the conductive member of the substrate support 11. In addition, in various embodiments, at least one of the source RF signal and the bias RF signal may pulsate.

Further, the power supply 30 may include a DC power supply 32 coupled to the plasma processing chamber 10. The DC power supply 32 includes a first DC generation portion 32a and a second DC generation portion 32b. In one embodiment, the first DC generation portion 32a is connected to the conductive member of the substrate support 11 and is configured to generate a first DC signal. The generated first DC signal is applied to the conductive member of the substrate support 11. In one embodiment, the first DC signal may be applied to another electrode provided in the electrostatic chuck 114, such as an adsorption electrode 201 described below. In one embodiment, the second DC generation portion 32b is connected to the conductive member of the shower head 13 and is configured to generate a second DC signal. The generated second DC signal is applied to the conductive member of the shower head 13. In various embodiments, the first and second DC signals may be made to pulsate. In addition, the first and second DC generation portions 32a and 32b may be provided in addition to the RF power supply 31, or the first DC generation portion 32a may be provided in place of the second RF generation portion 31b.

The exhaust system 40 may be connected to, for example, a gas outlet 10e provided at a bottom portion of the plasma processing chamber 10. The exhaust system 40 may include a pressure regulating valve and a vacuum pump. The pressure regulating valve regulates the pressure in the plasma processing space 10s. The vacuum pump may include a turbo molecular pump, a dry pump or a combination thereof.

<Plasma Processing Method>

Next, the plasma processing performed by using the plasma processing system configured as described above will be described. As the plasma processing, for example, an etching processing or a film forming processing is performed.

First, the substrate W is carried into the plasma processing chamber 10 and the substrate W is placed on the electrostatic chuck 114. Thereafter, by applying a DC voltage to the adsorption electrode 201, which will be described later, of the electrostatic chuck 114, the substrate W is electrostatically adsorbed to and held by the electrostatic chuck 114 by Coulomb force. In this connection, the substrate W is controlled to a desired temperature. Further, after the substrate W is carried into, the inside of the plasma processing chamber 10 is depressurized to a desired vacuum level by the exhaust system 40.

Next, the processing gas is supplied from the gas supply portion 20 to the plasma processing space 10s via the shower head 13. Further, the source RF power for plasma generation is supplied to the conductive member of the substrate support 11 and/or the conductive member of the shower head 13 by the first RF generation portion 31a of the RF power supply 31. In addition, the processing gas is excited to generate plasma. In this connection, the bias RF signal for ion insertion may be supplied by the second RF generation portion 31b. In addition, the substrate W is subjected to plasma processing by the action of the generated plasma.

<Electrostatic Chuck>

Figure 3:
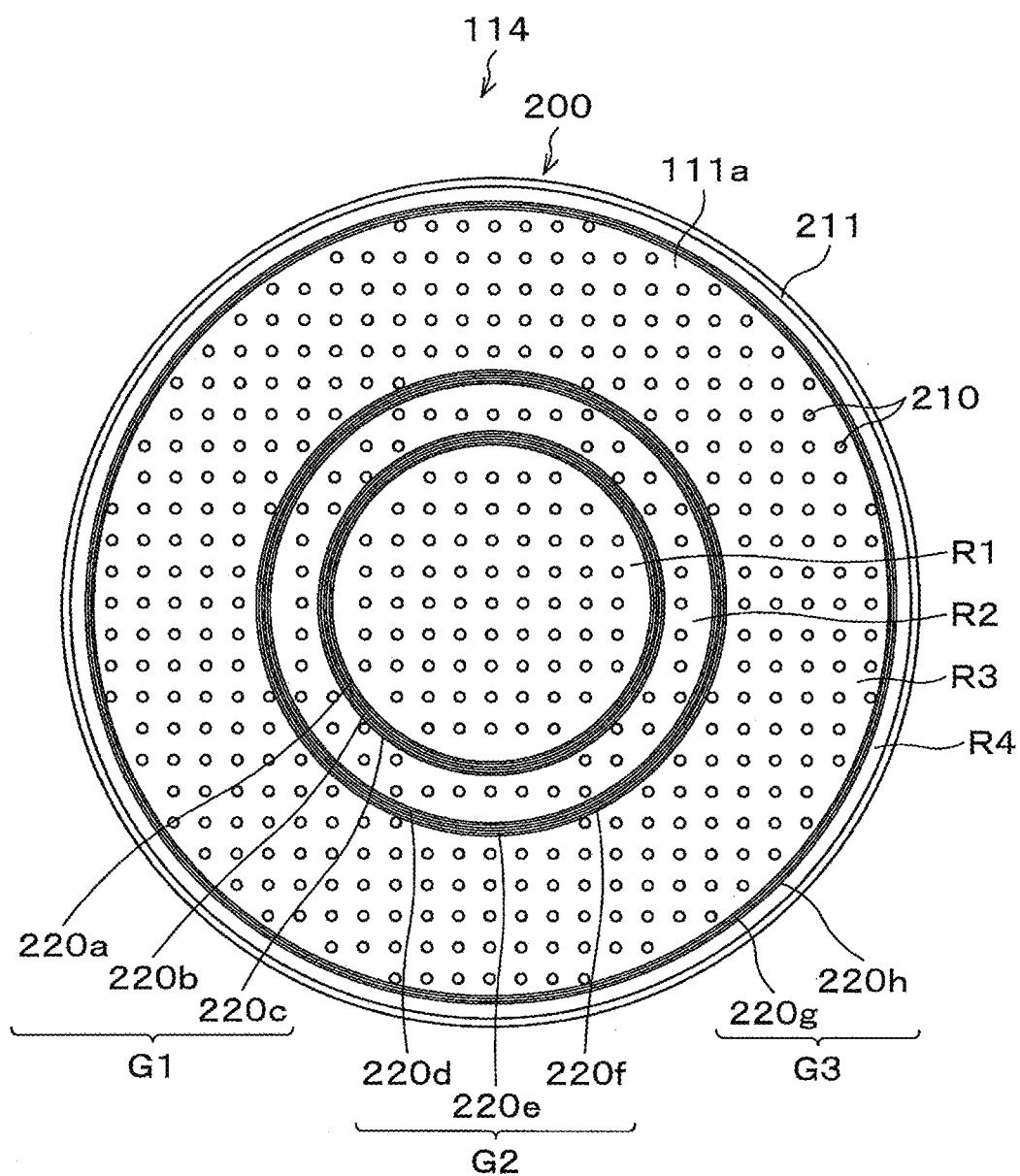
FIG. 3 is a plan view schematically illustrating the configuration of an electrostatic chuck.
Figure 4:
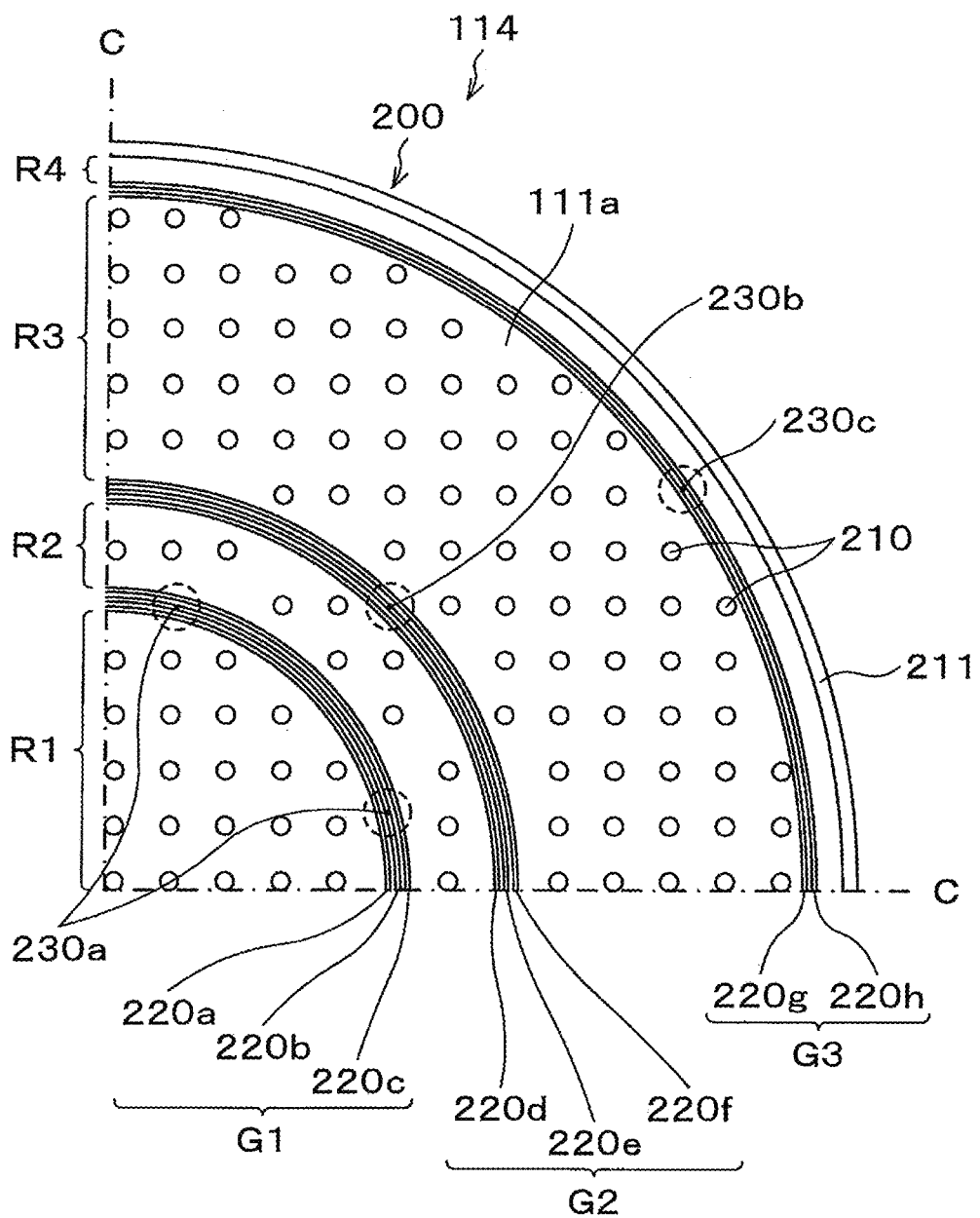
FIG. 4 is a plan view schematically illustrating the partial configuration of an electrostatic chuck.
Figure 5:
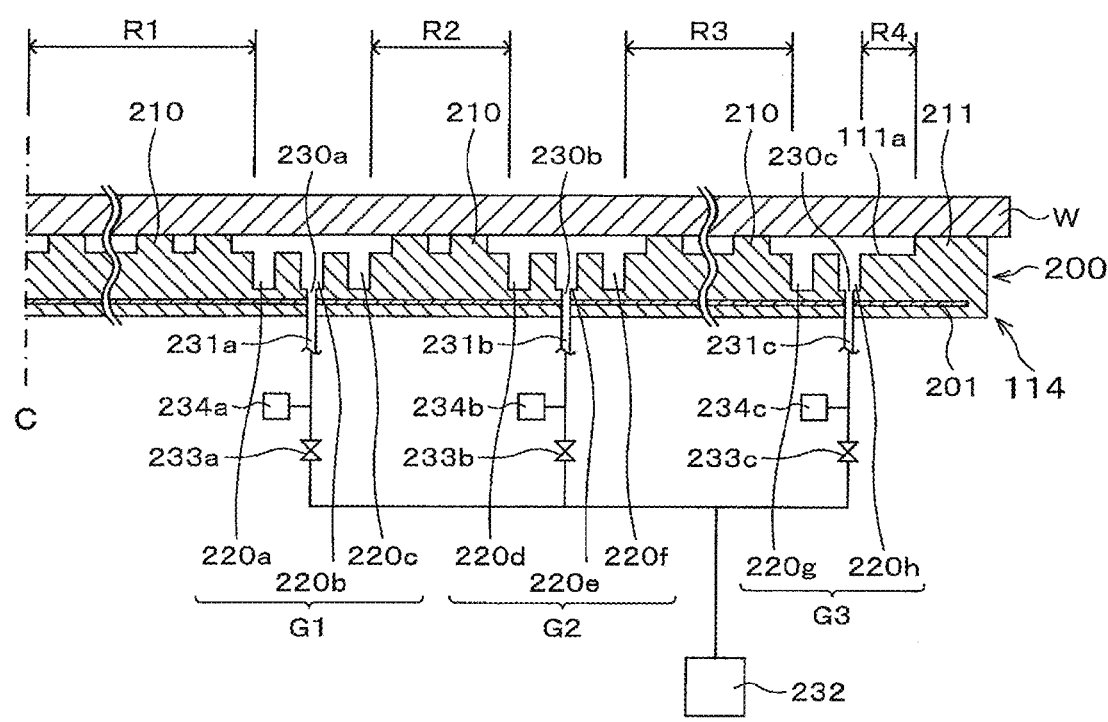
FIG. 5 is a longitudinal sectional view schematically illustrating the configuration of an electrostatic chuck.

Next, the configuration of the electrostatic chuck 114 described above will be described. FIG. 3 is a plan view schematically illustrating the configuration of the electrostatic chuck 114. FIG. 4 is a plan view schematically illustrating the partial configuration of the electrostatic chuck 114. FIG. 5 is a longitudinal sectional view schematically illustrating the configuration of the electrostatic chuck 114. In FIGS. 4 and 5, C indicates a center line of the electrostatic chuck 114.

As illustrated in FIGS. 3 to 5, the electrostatic chuck 114 has a chuck body portion 200. The chuck body portion 200 is made of a dielectric and is formed of ceramics, such as alumina ($Al_2O_3$). The electrostatic chuck 114 has a substantially disk shape. Inside the chuck body portion 200, for example, the adsorption electrode 201 connected to the first DC generation portion 32a is provided. The electrostatic chuck 114 may adsorb the substrate W by applying a DC voltage to the adsorption electrode 201 from the first DC generation portion 32a to generate Coulomb force. Further, a heater (not shown) may be provided inside the chuck body portion 200.

The upper surface of the chuck body portion 200 has the substrate support surface 111a for supporting the substrate W. The substrate support surface 111a is formed, for example, in a circular shape having a diameter smaller than that of the supported substrate W. As a result, when the substrate W is supported by the substrate support surface 111a, the outer peripheral portion of the substrate W projects outward from the end portion of the substrate support surface 111a.

The substrate support surface 111a of the chuck body portion 200 has substrate contact portions 210, which are a plurality of protrusions, and an outer peripheral contact portion 211. The substrate contact portions 210 are dots having a cylindrical shape and provided so as to project from the substrate support surface 111a. The plurality of substrate contact portions 210 are provided inside the outer peripheral contact portion 211. The outer peripheral contact portion 211 is provided in an annular shape on the outermost peripheral portion of the substrate support surface 111a so as to project from the substrate support surface 111a. The upper surfaces of the plurality of substrate contact portions 210 and the outer peripheral contact portion 211 are formed to have the same height and to be flat, and come into contact with the substrate W when the substrate W is supported by the substrate support surface 111a. Accordingly, the substrate W is supported by the plurality of substrate contact portions 210 and the outer peripheral contact portion 211.

Further, the substrate support surface 111a of the chuck body portion 200 has a plurality of annular grooves 220. The annular grooves 220 are recessed from the substrate support surface 111a to form annular shapes, and in the present embodiment, the annular grooves 220 are provided in circular annular shapes. Further, the annular grooves 220 have rectangular shapes in a cross-sectional view.

Figure 6:
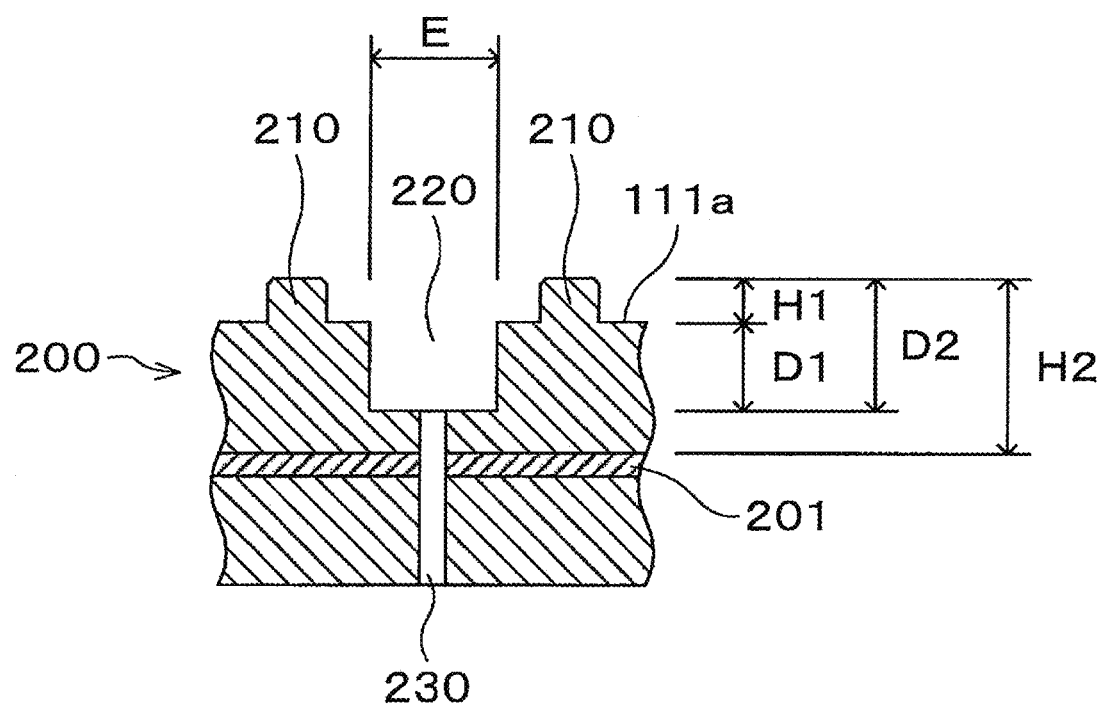
FIG. 6 is a longitudinal sectional view schematically illustrating the configuration in the periphery of an annular groove.

As illustrated in FIG. 6, the depth D1 of the annular grooves 220 (the depth from the substrate support surface 111a to the bottom portion of the annular grooves 220) is equal to or higher than the height H1 of the substrate contact portion 210 (the height from the substrate support surface 111a to the upper surface of the substrate contact portion 210). Further, the depth D2 of the annular grooves 220 (the depth from the upper surface of the substrate contact portion 210 to the bottom portion of the annular grooves 220) is at least twice the height H1 of the substrate contact portion 210. For example, the height H1 of the substrate contact portion 210 is 5 µm to 20 µm, while the depth D2 of the annular grooves 220 is 10 µm to 40 µm.

The upper limit of the depths D1 and D2 of the annular grooves 220 is not particularly limited. For example, the annular grooves 220 may extend vertically downward and are located slightly above the upper surface of the adsorption electrode 201, such that the bottom portion thereof does not reach the adsorption electrode 201. Further, for example, the depth D1 of the annular grooves 220 may be equal to or less than a half of the distance H2 from the upper surface of the substrate contact portion 210 to the upper surface of the adsorption electrode 201.

The width E of the annular grooves 220 is not particularly limited, but is, for example, 0.3 mm to 10 mm.

As illustrated in FIGS. 3 to 5, in one embodiment, for example, eight annular grooves 220a to 220h are arranged side by side on the substrate support surface 111a in this order from the inside to the outside in the radial direction. The center positions of the eight annular grooves 220a to 220h in a plan view are the same as the center positions of the substrate support surface 111a, that is, the eight annular grooves 220a to 220h are provided on concentric circles.

In one embodiment, the eight annular grooves 220a to 220h form, for example, three annular groove groups G1 to G3. The three annular groove groups G1 to G3 are arranged side by side in this order from the inside to the outside in the radial direction.

Figure 7:
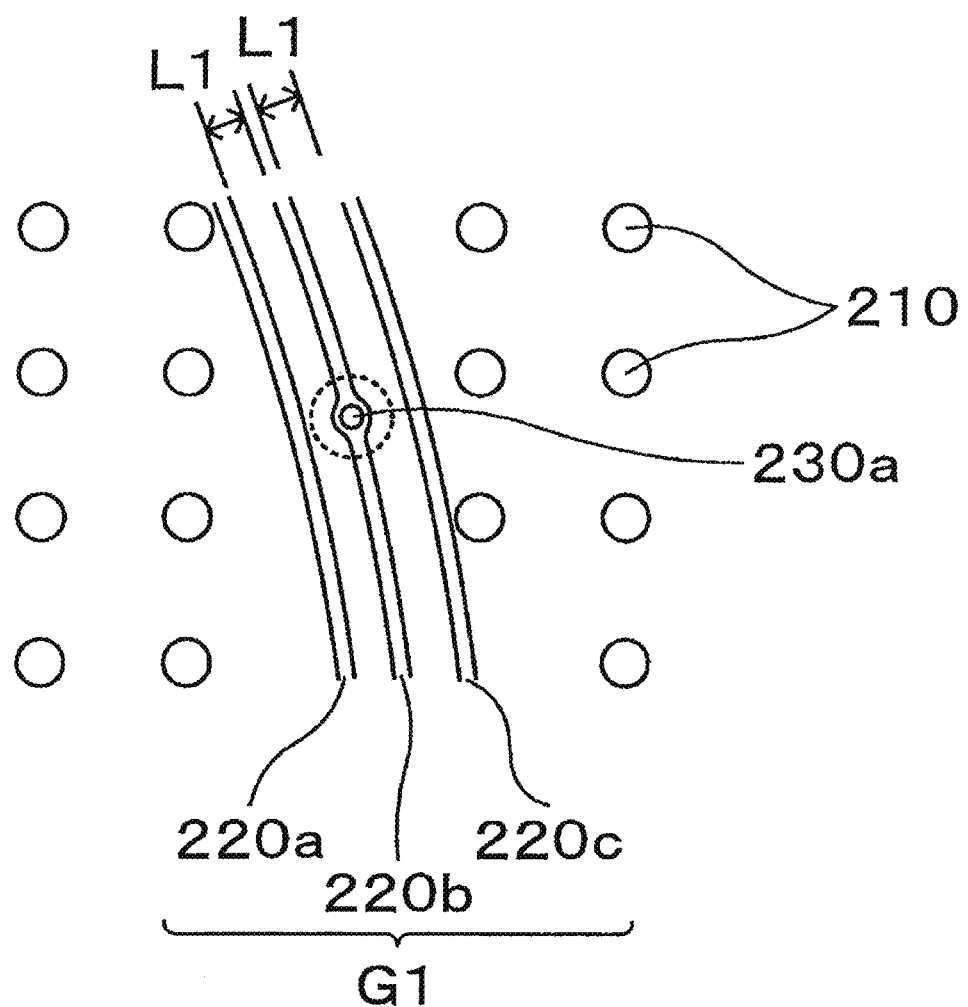
FIG. 7 is a plan view schematically illustrating the configuration of a first annular groove group.

As illustrated in FIG. 7, the first annular groove group G1 is composed of three annular grooves 220a to 220c. The first inner annular groove 220a and the first intermediate annular groove 220b are adjacent and close to each other, and the first intermediate annular groove 220b and the first outer annular groove 220c are also adjacent and close to each other. The groove distance L1 between the first inner annular groove 220a and the first intermediate annular groove 220b (the groove distance L1 between the first intermediate annular groove 220b and the first outer annular groove 220c) is, for example, 1 mm to 10 mm.

Figure 8:
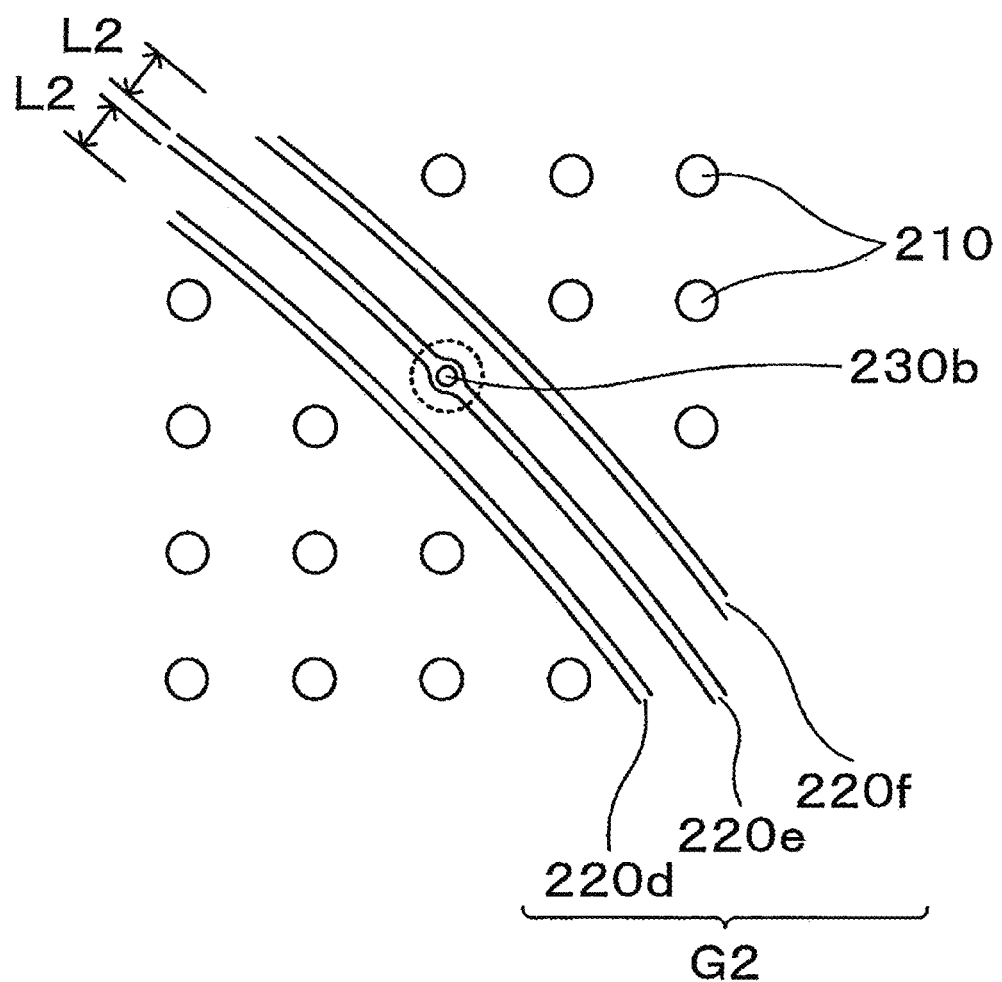
FIG. 8 is a plan view schematically illustrating the configuration of a second annular groove group.

As illustrated in FIG. 8, the second annular groove group G2 is composed of three annular grooves 220d to 220f.

The second inner annular groove 220d and the second intermediate annular groove 220e are adjacent and close to each other, and the second intermediate annular groove 220e and the second outer annular groove 220f are also adjacent and close to each other. The groove distance L2 between the second inner annular groove 220a and the second intermediate annular groove 220e (the groove distance L2 between the second intermediate annular groove 220e and the second outer annular groove 220f) is, for example, 1 mm to 10 mm.

Figure 9:
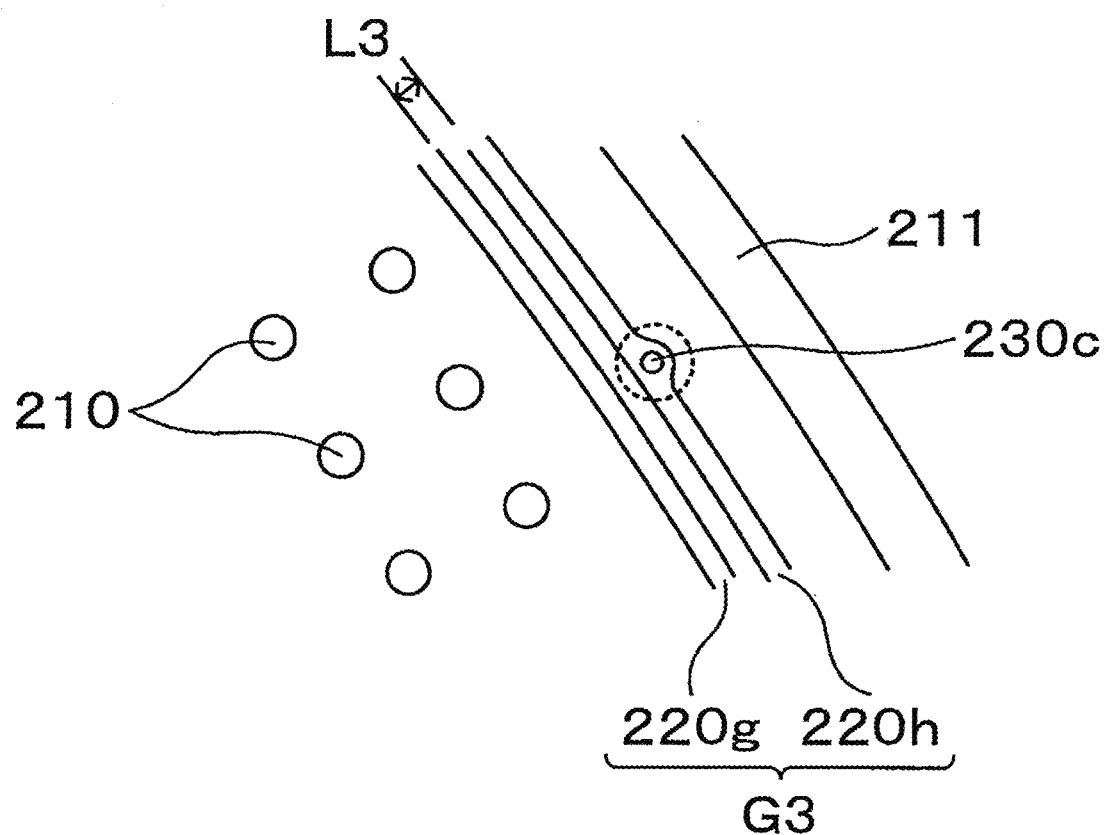
FIG. 9 is a plan view schematically illustrating the configuration of a third annular groove group.

As illustrated in FIG. 9, the third annular groove group G3 is composed of two annular grooves 220g to 220h. The third inner annular groove 220g and the third outer annular groove 220h are adjacent and close to each other. The groove distance L3 between the third inner annular groove 220g and the third outer annular groove 220h is, for example, 1 mm to 10 mm.

Further, as illustrated in FIGS. 3 to 5, the substrate support surface 111a is divided into four regions R1 to R4 by the three annular groove groups G1 to G3. The first region R1 is a circular region on the inner side of the first annular groove group G1 in the radial direction. The second region R2 is an annular region between the first annular groove group G1 and the second annular groove group G2. The third region R3 is an annular region between the second annular groove group G2 and the third annular groove group G3. The fourth region R4 is an annular region between the third annular groove group G3 and the outer peripheral contact portion 211. The plurality of substrate contact portions 210 described above are arranged in each of the regions R1 to R3. Further, in the illustrated example, the radial width of the fourth region R4 is small, but the radial width is not limited thereto, and may be large depending on the situation.

The chuck body portion 200 is provided with a plurality of heat transfer gas supply holes 230. As illustrated in FIG. 6, the heat transfer gas supply holes 230 are provided to penetrate the chuck body portion 200 from the bottom portion of the annular groove 220. As illustrated in FIGS. 3 to 5, in one embodiment, the chuck body portion 200 is provided with heat transfer gas supply holes 230a, 230b, 230c respectively in the three annular groove groups G1 to G3. In addition, for example, helium gas is used as the heat transfer gas (backside gas).

The first annular groove group G1 is provided with a plurality of first heat transfer gas supply holes 230a at the bottom portion of the first intermediate annular groove 220b. A first heat transfer gas supply path 231a is connected to the first heat transfer gas supply hole 230a, and the first heat transfer gas supply path 231a communicates with a heat transfer gas supply source 232. The first heat transfer gas supply path 231a is provided with a first control valve 233a and a first pressure gauge 234a from the heat transfer gas supply source 232 side. The first control valve 233a is controlled to be opened to the extent that the pressure detected by the first pressure gauge 234a becomes a desired pressure. As a result, the first control valve 233a is configured to control the flow rate or pressure of the heat transfer gas supplied from the heat transfer gas supply source 232 via the first heat transfer gas supply path 231a. In addition, the first control valve 233a and the first pressure gauge 234a may be integrally provided. In addition, the heat transfer gas supplied from the heat transfer gas supply source is supplied to the first intermediate annular groove 220b via the first heat transfer gas supply path 231a and the first heat transfer gas supply hole 230a, and diffuses in the circumferential direction along the first intermediate annular groove 220b. Further, the heat transfer gas flows into the annular grooves 220a and 220c close to the first intermediate annular groove 220b and diffuses in the circumferential direction along the annular grooves 220a and 220c. Moreover, the heat transfer gas is also supplied to the space between the back surface of the substrate W and the substrate support surface 111a (hereinafter, referred to as "heat transfer space"). In addition, the first heat transfer gas supply hole 230a, the first heat transfer gas supply path 231a, and the first control valve 233a may be provided in any one of the annular grooves 220a to 220c.

The second annular groove group G2 is provided with a plurality of second heat transfer gas supply holes 230b at the bottom portion of the second intermediate annular groove 220e. A second heat transfer gas supply path 231b as a second gas supply path is connected to the second heat transfer gas supply hole 230b, and the second heat transfer gas supply path 231b communicates with the heat transfer gas supply source 232. The second heat transfer gas supply path 231b is provided with a second control valve 233b and a second pressure gauge 234b from the heat transfer gas supply source 232 side. The second control valve 233b and the second pressure gauge 234b have the same configuration as the first control valve 233a and the first pressure gauge 234a, respectively, and the second control valve 233b is configured to control the flow rate or pressure of the heat transfer gas. In addition, similarly to the first annular groove group G1, the heat transfer gas supplied from the heat transfer gas supply source via the second heat transfer gas supply path 231b and the second heat transfer gas supply hole 230b diffuses in the circumferential direction along the annular grooves 220d, 220e, and 220f, and is also supplied to the heat transfer space. In addition, the second heat transfer gas supply hole 230b, the second heat transfer gas supply path 231b, and the second control valve 233b may be provided in any of the annular grooves 220d to 220f.

The third annular groove group G3 is provided with a plurality of third heat transfer gas supply holes 230c at the bottom portion of the third outer annular groove 220h. A third heat transfer gas supply path 231c as a third gas supply path is connected to the third heat transfer gas supply hole 230c, and the third heat transfer gas supply path 231c communicates with the heat transfer gas supply source 232. The third heat transfer gas supply path 231c is provided with a third control valve 233c and a third pressure gauge 234c from the heat transfer gas supply source 232 side. The third control valve 233c and the third pressure gauge 234c have the same configuration as the first control valve 233a and the first pressure gauge 234a, respectively, and the third control valve 233c is configured to control the flow rate or pressure of the heat transfer gas. In addition, similarly to the first annular groove group G1, the heat transfer gas supplied from the heat transfer gas supply source via the third heat transfer gas supply path 231c and the third heat transfer gas supply hole 230c diffuses in the circumferential direction along the annular grooves 220g and 220h, and is also supplied to the heat transfer space. In addition, the third heat transfer gas supply hole 230c, the third heat transfer gas supply path 231c, and the third control valve 233c may be provided in any of the annular grooves 220g to 220h.

In addition, although the heat transfer gas supply paths 231a to 231c in the present embodiment merge and communicate with the common heat transfer gas supply source 232, they may communicate with their respective individual heat transfer gas supply sources. Further, although the flow rate or pressure of the heat transfer gas supplied from the heat transfer gas supply holes 230a to 230c in the present embodiment is controlled by using the control valves 233a to 233c, in addition to this, the flow rate or pressure of the heat transfer gas may be controlled by changing the diameters of the heat transfer gas supply holes 230a to 230c. In addition, for example, when the pressures of the heat transfer gas supplied from the heat transfer gas supply holes 230a to 230c are different from one another, the pressures of the heat transfer space for the three regions R1 to R3 are also different from one another.

Figure 10:
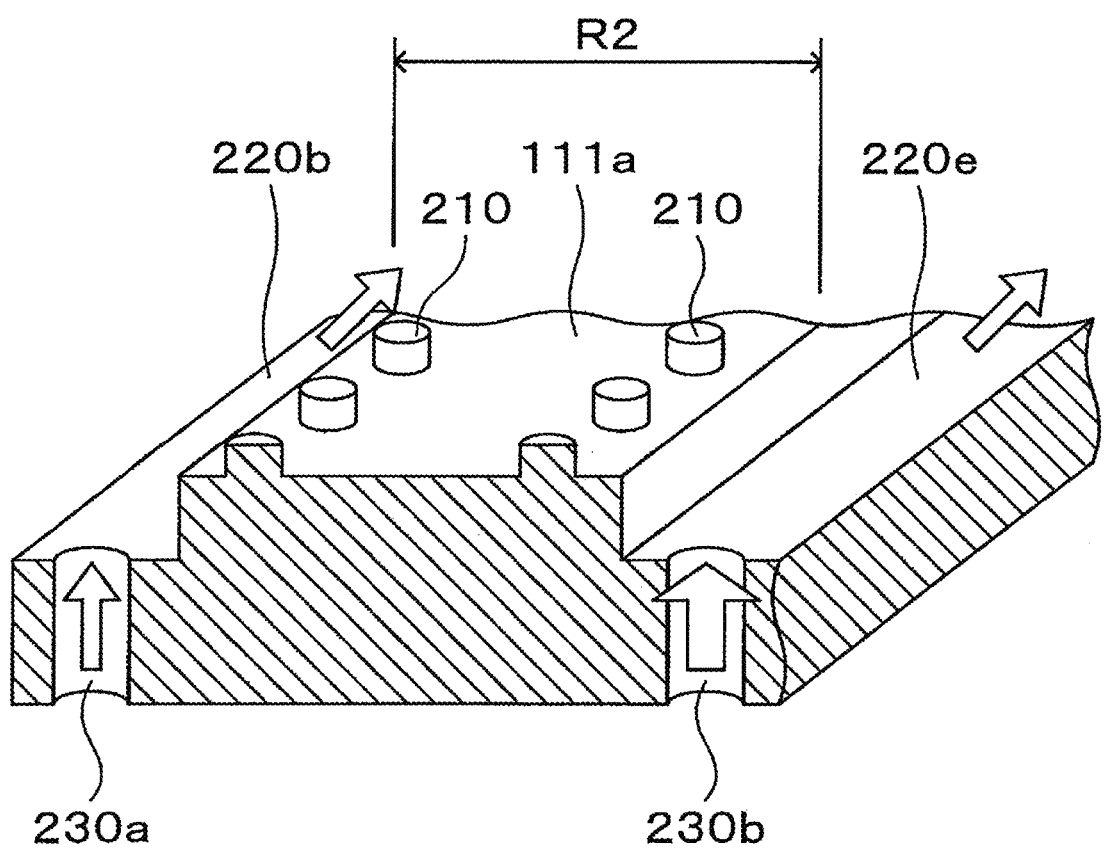
FIG. 10 is an explanatory view illustrating the function of an annular groove.

FIG. 10 is an explanatory view illustrating a state in which a pressure difference is generated in the heat transfer space between the regions R1 and R2 when the pressure of the heat transfer gas from the second heat transfer gas supply hole 230b is higher than the pressure from the first heat transfer gas supply hole 230a. In addition, in FIG. 10, for simplification of the description, only the annular grooves 220b and 220e provided with the heat transfer gas supply holes 230a and 230b are illustrated. As described above, in the first annular groove group G1, the heat transfer gas diffuses in the circumferential direction along the annular groove 220b (220a, 220c), and in the second annular groove group G2, the heat transfer gas diffuses in the circumferential direction along the annular groove 220e (220d, 220f). In such a case, the gas conductance in the heat transfer space becomes low between the regions R1 and R2 (diameter direction), and a pressure difference is generated in the heat transfer space between the regions R1 and R2. In other words, the pressure in the heat transfer space in the second region R2 is higher than the pressure in the heat transfer space in the first region R1.

Figure 11:
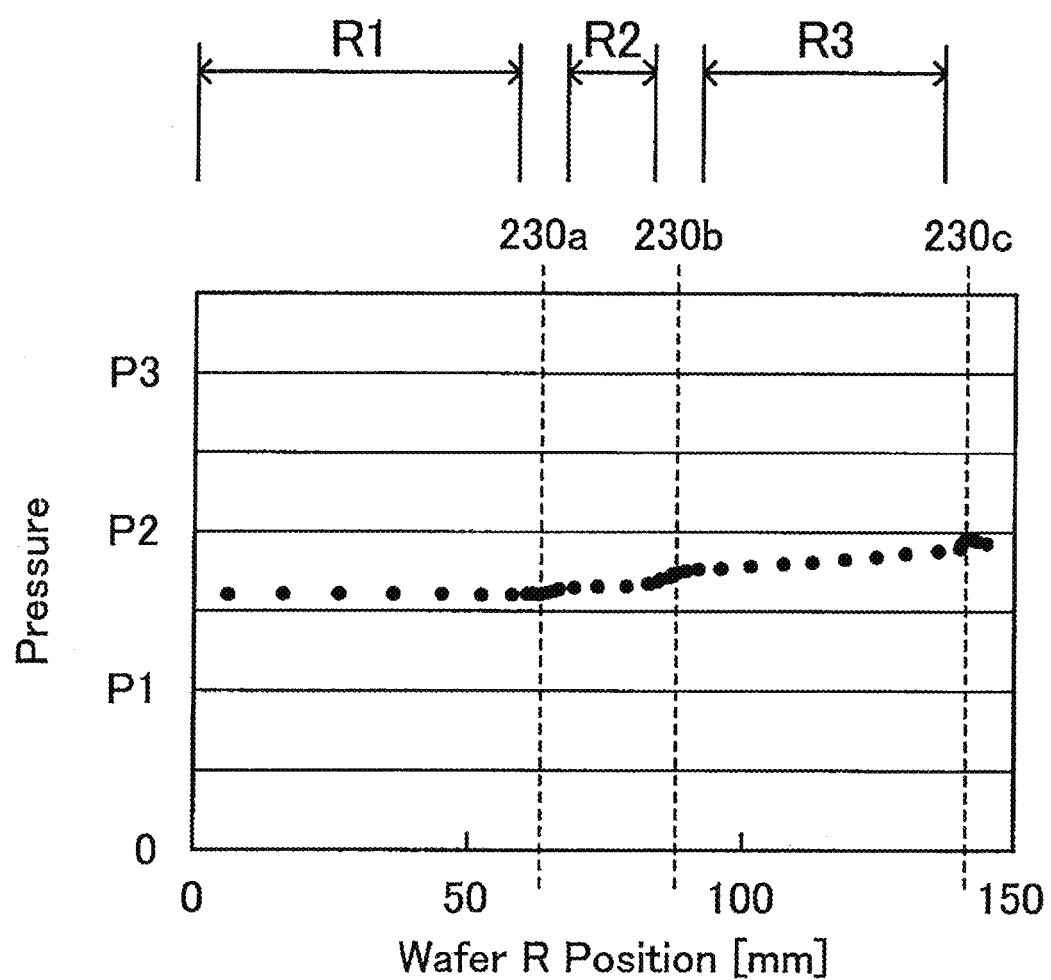
FIG. 11 is a graph illustrating the experimental result (pressure of a heat transfer space) in a comparative example.
Figure 12:
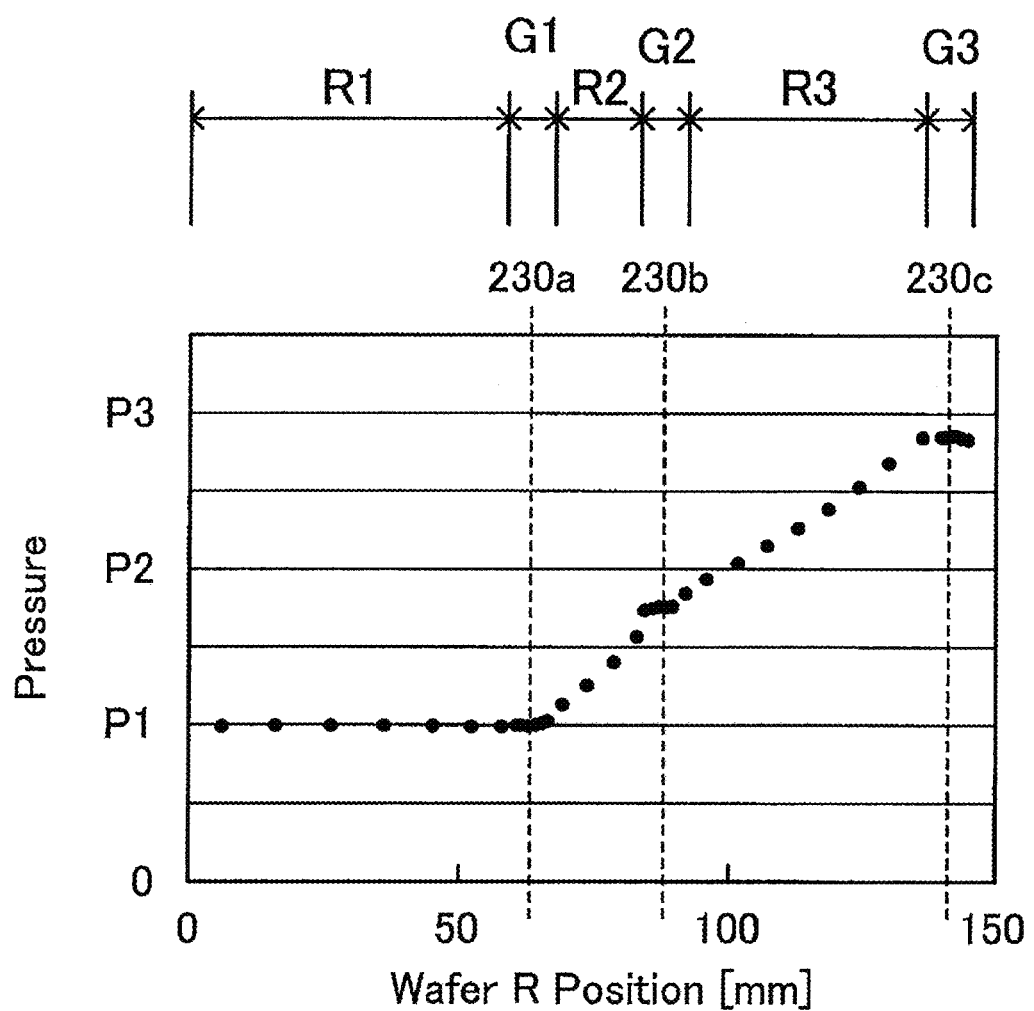
FIG. 12 is a graph illustrating the experimental result (pressure of a heat transfer space) in the present embodiment.

According to the above theory, for example, when the pressures of the heat transfer gas supplied from the heat transfer gas supply holes 230a to 230c grow larger sequentially from the transfer gas supply holes 230 a to 230c, the pressures in the heat transfer spaces of the regions R1 to R3 also grow larger from the regions R1 to R3. The present inventors checked the pressures in the heat transfer spaces of the regions R1 to R3 when the pressures of the heat transfer gas supplied from the heat transfer gas supply holes 230a, 230b, and 230c are set to P1, P2, and P3 (P1<P2<P3), respectively. FIG. 11 illustrates the experimental results when the annular groove 220 is not provided on the substrate support surface 111a as a comparative example, that is, when the heat transfer gas supply holes 230a, 230b, and 230c are provided on the substrate support surface 111a, respectively. FIG. 12 illustrates the experimental results when the annular grooves 220a to 220h are provided on the substrate support surface 111a as in the present embodiment. In FIGS. 11 and 12, the vertical axis indicates the pressure in the heat transfer space, and the horizontal axis indicates the radial position on the substrate W in a specific direction. In addition, in FIGS. 11 and 12, the fourth region R4 is not shown for ease of description.

As illustrated in FIG. 11, in the comparative example, the pressures in the heat transfer spaces became substantially uniform in the radial direction in the substrate W, and the pressure difference in the heat transfer spaces in the regions R1 to R3 became small. This is because the annular groove 220 is not formed on the substrate support surface 111a, so that the gas conductance of the heat transfer space becomes high inside and outside of the heat transfer gas supply holes 230a to 230c in the radial direction, and the heat transfer gas diffuses in the radial direction.

In contrast, as illustrated in FIG. 12, in the present embodiment, the pressure difference may be generated in the heat transfer spaces of the regions R1 to R3. The heat transfer gas diffuses from the first heat transfer gas supply hole 230a into the heat transfer space of the first annular groove group G1 and the first region R1. In addition, the pressure in the heat transfer space in the first annular groove group G1 and the first region R1 is substantially the same as the pressure P1 of the heat transfer gas from the first heat transfer gas supply hole 230a.

The heat transfer gas from the second heat transfer gas supply hole 230b diffuses into the heat transfer space of the second annular groove group G2, and the pressure in the heat transfer space is substantially the same as the pressure P2 of the heat transfer gas from the second heat transfer gas supply hole 230b. Further, the pressure in the heat transfer space of the second region R2 changes from P1 to P2 from the inside toward the outside in the radial direction. Here, in the heat transfer space of the second region R2, the heat transfer gas supplied by the pressure P1 from the first heat transfer gas supply hole 230a and the heat transfer gas supplied by the pressure P2 from the second heat transfer gas supply hole 230b diffuse. Then, in the second region R2, the pressure gradually changes from P1 to P2 from the inside toward the outside in the radial direction.

The heat transfer gas from the third heat transfer gas supply hole 230c diffuses into the heat transfer space of the third annular groove group G3, and the pressure in the heat transfer space is substantially the same as the pressure P3 of the heat transfer gas from the third heat transfer gas supply hole 230c. Further, the pressure in the heat transfer space of the third region R3 gradually changes from P2 to P3 from the inside toward the outside in the radial direction.

As described above, according to the present embodiment, a pressure difference may be generated in the heat transfer spaces of the regions R1 to R3, and the pressures in the heat transfer spaces of the regions R1 to R3 may be controlled and the temperature of the substrate W may be controlled for each of the regions R1 to R3. In this connection, by providing the annular grooves 220a to 220h, a pressure difference may be generated in the heat transfer spaces of the regions R1 to R3 without contacting the substrate W, so that the local temperature singularity point that comes into existence when the seal band comes into contact with the substrate as in the conventional case may not exist. Accordingly, according to the present embodiment, the temperature controllability of the substrate W may be improved, and the plasma processing may be appropriately performed.

In addition, as described above, according to the present embodiment, when the substrate support surface 111a is divided into the regions R1 to R3, it does not come into contact with the substrate W and, thus, it does not wear out nor deform unlike the conventional seal band. Accordingly, a change over time is unlikely to occur, and the pressures in the heat transfer spaces of the regions R1 to R3 may be appropriately controlled.

Here, when the heat transfer space is divided into a plurality of regions by a seal band and the temperature of the substrate is controlled by controlling the pressure for each region as in the conventional case, the temperature of the substrate changes abruptly at the boundary of the regions. In this respect, in the present embodiment, since the pressure change in the radial direction in the heat transfer space is gradual, the temperature of the substrate W may also be gradually changed in the radial direction. Accordingly, according to the present embodiment, the temperature controllability of the substrate W may be further improved.

Further, as a result of diligent studies by the present inventors, when the depth D2 of the annular groove 220 is twice or more the height H1 of the substrate contact portion 210 as in the present embodiment, the effect of the annular groove 220 described above, that is, it was found that the effect of controlling the pressure in the heat transfer spaces in the regions R1 to R3 may be exerted. Although the upper limit of the depths D1 and D2 of the annular groove 220 is not particularly limited, for example, the larger the depths D1 and D2 of the annular groove 220 are, the more the above-mentioned effect may be enjoyed remarkably. However, there are restrictions on the device configuration, for example, even when the bottom portion thereof does not reach the adsorption electrode 201, the annular groove 220 may extend vertically downward until it is located slightly above the upper surface of the adsorption electrode 201. Further, for example, the depth D1 of the annular groove 220 may be equal to or less than a half of the distance H2 from the upper surface of the substrate contact portion 210 to the upper surface of the adsorption electrode 201.

Further, the width E of the annular groove 220 or the number of the annular grooves 220 is not limited to the present embodiment. For example, even when the width E of the annular groove 220 is small and there is only one annular groove 220, the effect of controlling the pressures in the heat transfer spaces in the above-mentioned regions R1 to R3 may be enjoyed. However, when the width E of the annular groove 220 is large and the number of annular grooves 220 is large, this effect may be shown more remarkably.

In other words, the shape and installation range of the annular groove 220 on the substrate support surface 111a are not limited to this embodiment. By arbitrarily setting the shape and installation range of the annular groove 220, the substrate support surface 111a may be divided into any regions, and the pressure in the heat transfer space in each region may be appropriately controlled.

Further, according to the present embodiment, since the heat transfer gas diffuses along the circumferential direction in each of the annular groove groups G1 to G3, the temperature uniformity in the circumferential direction in the substrate W may be improved.

Next, the results of the effects of the present embodiment verified by the present inventors will be described. In this verification, an experiment was conducted on the temperature distribution on the substrate W when the supply pressure of the heat transfer gas was changed. In addition, although the heat transfer gas supply holes 230a to 230c are provided at three locations in the radial direction in the above embodiment, the first heat transfer gas supply hole 230a is omitted in this experiment, and heat transfer gas was supplied from the heat transfer gas supply holes 230b and 230c. That is, in this experiment, the substrate support surface 111a is divided into two regions, i.e., a central region (first region R1 and second region R2) and an outer peripheral region (third region R3).

Figure 13:
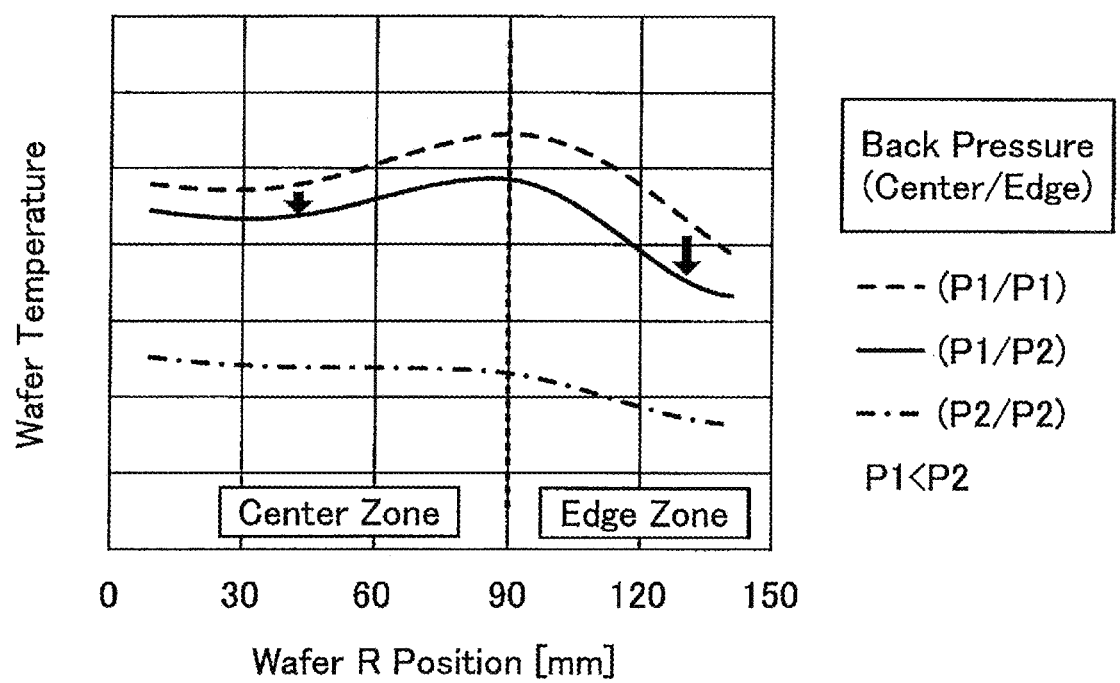
FIG. 13 is a graph illustrating the experimental result (temperature of a substrate) in a comparative example.
Figure 14:
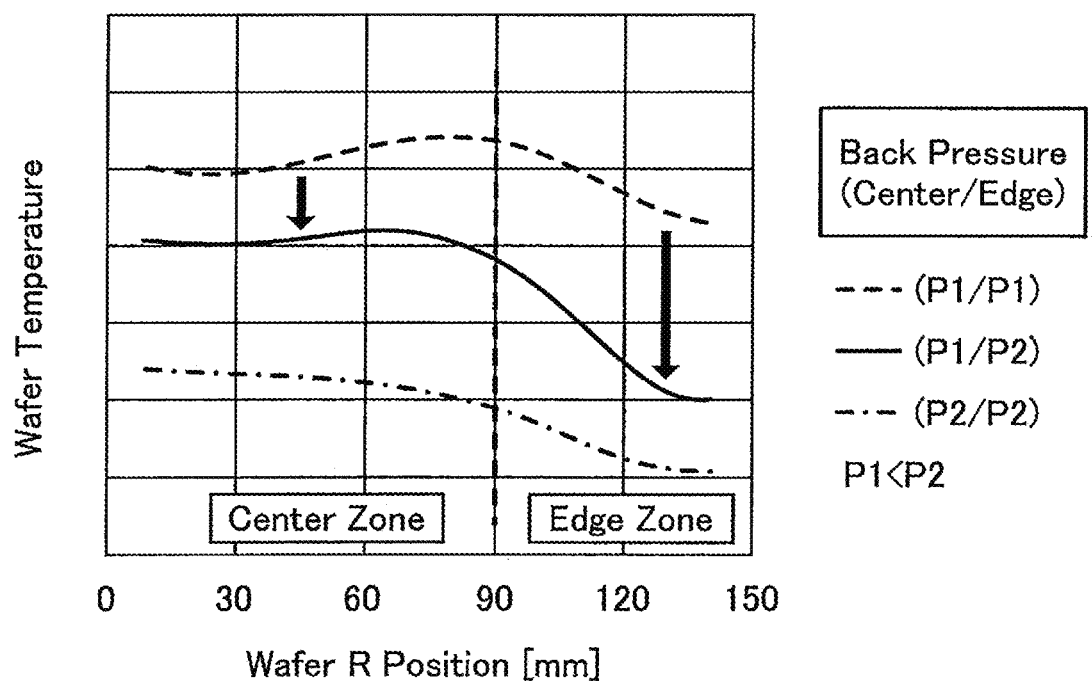
FIG. 14 is a graph illustrating the experimental result (temperature of a substrate) in the present embodiment.

FIG. 13 illustrates the experimental results when the annular groove 220 is not provided on the substrate support surface 111a as a comparative example, that is, when the heat transfer gas supply holes 230b and 230c are provided on the substrate support surface 111a, respectively. FIG. 14 illustrates the experimental results when the second annular groove group G2 (annular groove 220d to 220f) and the third annular groove group G3 (annular groove 220g, 220h) are provided on the substrate support surface 111a as in the present embodiment. In FIGS. 13 and 14, the vertical axis indicates the temperature of the substrate W, and the horizontal axis indicates the radial position on the substrate W in a specific direction. Further, in FIGS. 13 and 14, "Back Pressure" indicates the pressure of the heat transfer gas, "Center" indicates the heat transfer gas from the second heat transfer gas supply hole 230b, and "Edge" indicates the heat transfer gas from the third heat transfer gas supply hole 230c. Further, "Center Zone" indicates a central region (first region R1 and second region R2), and "Edge Zone" indicates an outer peripheral region (third region R3).

As illustrated in FIG. 13, in the comparative example, even when the pressures of the heat transfer gas from the heat transfer gas supply holes 230b and 230c are made to be different from each other, the difference between the temperature of the substrate W in the central region and the temperature of the substrate W in the outer peripheral region is small. That is, it was difficult to control the substrate W for each region.

In contrast, as illustrated in FIG. 14, in the present embodiment, the pressures of the heat transfer gas from the heat transfer gas supply holes 230b and 230c are made different from each other. In such a case, the heat transfer coefficient with the substrate W in the outer peripheral region becomes higher than the heat transfer coefficient with the substrate W in the central region. As a result, the temperature of the substrate W in the outer peripheral region may be lowered with respect to the temperature of the substrate W in the central region. That is, the temperature difference between in the central region and the outer peripheral region the substrate W may be increased, and the substrate W may be controlled for each region. Accordingly, it was found that by providing the annular groove 220 on the substrate support surface 111a as in the present embodiment, the substrate support surface 111a may be divided into a plurality of regions and the temperature of the substrate W may be controlled for each region.

Other Embodiments

In the above embodiment, eight annular grooves 220a to 220h are provided on the substrate support surface 111a, and three annular groove groups G1 to G3 are configured to divide the substrate support surface 111a into three regions R1 to R3. However, the number of annular grooves 220 and the number of annular groove groups G are not limited thereto.

Further, although the annular groove group G1 and G2 are composed of three annular grooves 220 and the annular groove group G3 is composed of two annular grooves 220 in the above embodiment, the number of annular grooves 220 constituting the annular groove group G is not limited thereto. For example, adjacent annular grooves 220 may be arranged apart in the radial direction, and the substrate support surface 111a may be divided into a plurality of regions by the annular grooves 220.

In any case, by arbitrarily setting the arrangement of the annular grooves 220 and the annular groove groups G on the substrate support surface 111a, the substrate support surface 111a may be divided into any regions, and the pressure in the heat transfer space in each region may be controlled appropriately.

Figure 15:
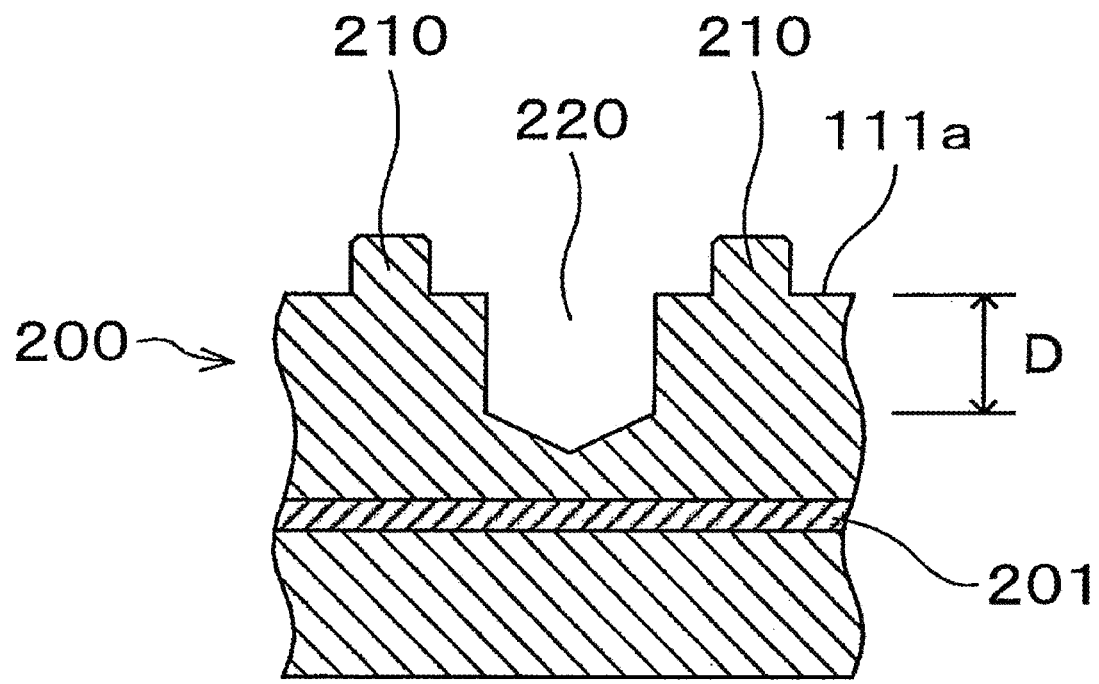
FIG. 15 is a longitudinal sectional view schematically illustrating the configuration in the periphery of an annular groove according to another embodiment.
Figure 16:
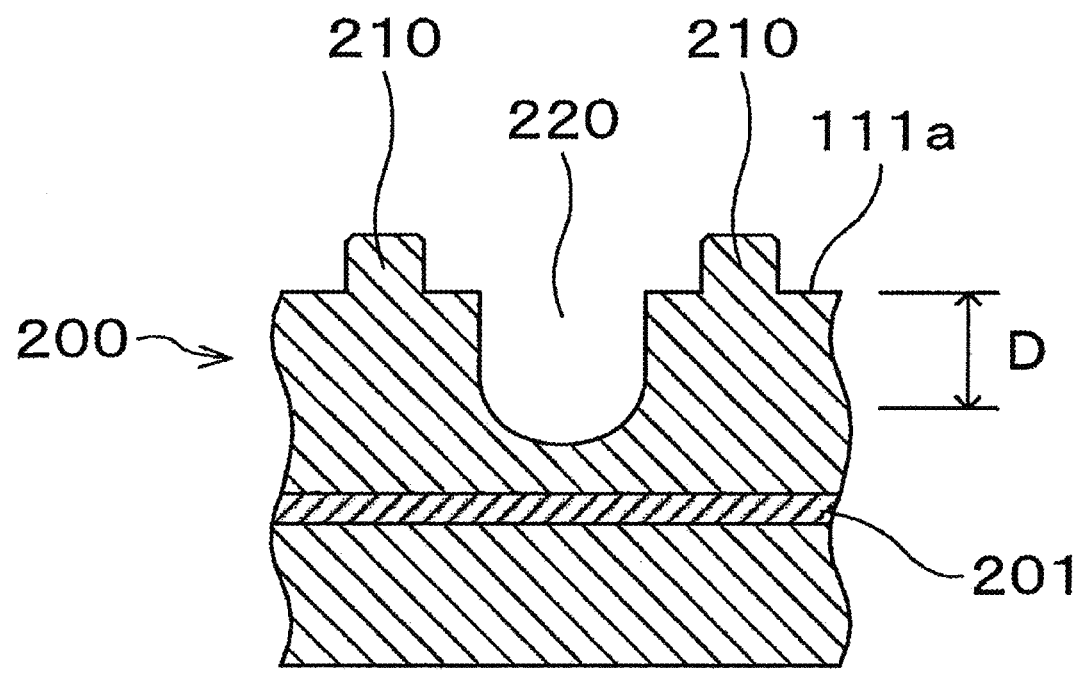
FIG. 16 is a longitudinal sectional view schematically illustrating the configuration in the periphery of an annular groove according to another embodiment.

In the above embodiment, the annular grooves 220 have a rectangular shape in a cross-sectional view, but the cross-sectional shape of the annular grooves 220 is not limited thereto. For example, as illustrated in FIG. 15, the annular grooves 220 have a pentagonal shape in a cross-sectional view, and the bottom portion of the annular grooves 220 may protrude in the vertical direction. Further, for example, as illustrated in FIG. 16, the bottom surface of the annular grooves 220 may be curved so as to project in the vertical direction. In any case, the effect of the annular grooves 220 described above, that is, the effect of controlling the pressure in the heat transfer space of the regions R1 to R3 may be shown.

Also in this embodiment, the depth D2 of the annular grooves 220 may be twice or more the height H1 of the substrate contact portion 210. In this case, the depth D2 of the annular grooves 220 indicates a depth from the substrate support surface 111a to the top of the bottom portion of the annular groove 220.

In the above embodiment, the annular grooves 220 are provided in a circular annular shape, but the planar shape of the annular grooves 220 is not limited thereto, and may be an annular shape. FIGS. 17 to 20 each illustrate the planar shape of the annular grooves 220 according to another embodiment. In addition, in FIGS. 17 to 20, in order to simplify the drawing, each of the annular groove groups G1 to G3 is illustrated as a single layer of an annular shape.

Figure 17:
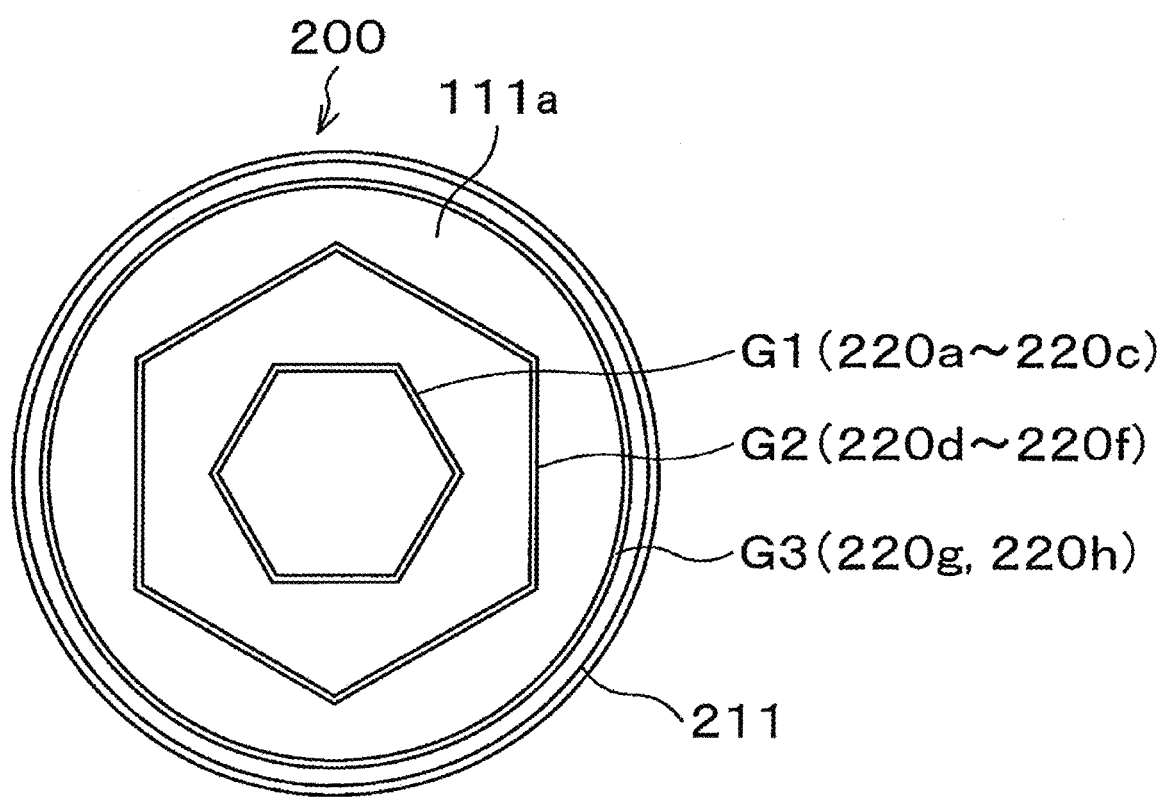
FIG. 17 is a plan view schematically illustrating the configuration of an annular groove according to another embodiment.

As illustrated in FIG. 17, the annular grooves 220 may have a polygonal shape. In the illustrated example, the annular grooves 220a to 220c of the first annular groove group G1 and the annular grooves 220d to 220f of the second annular groove group G2 are polygonal, but any or all of the annular grooves 220a to 220h may have a polygonal shape.

Figure 18:
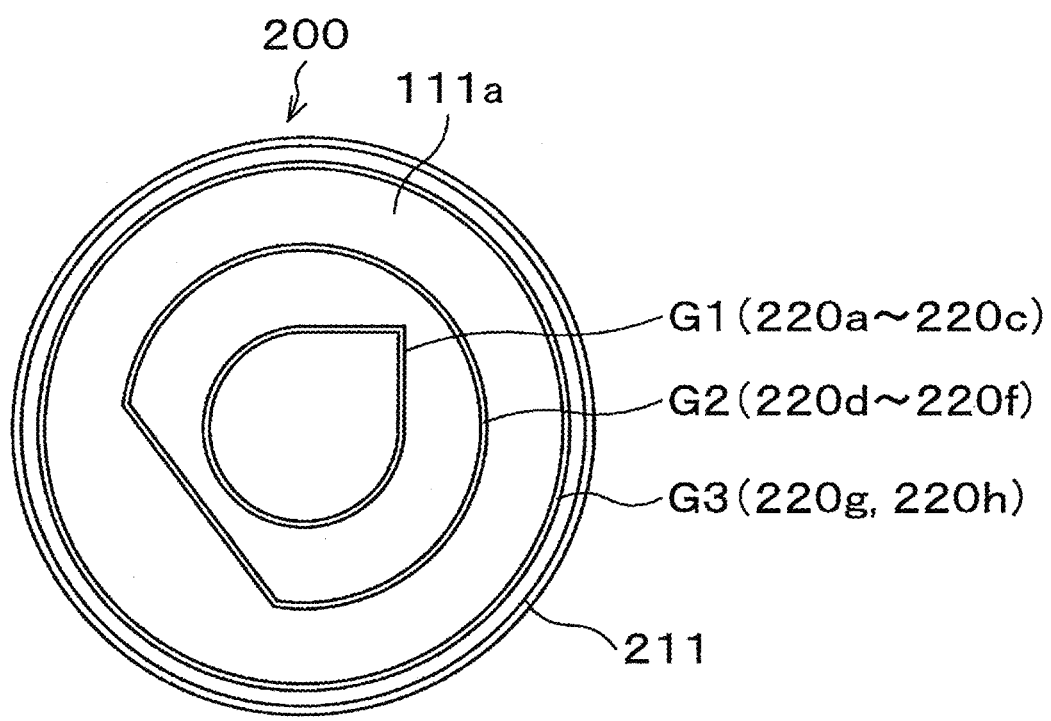
FIG. 18 is a plan view schematically illustrating the configuration of an annular groove according to another embodiment.

As illustrated in FIG. 18, the annular grooves 220 may have another planar shape instead of an annular shape. Further, the plurality of annular grooves 220 may have different center positions in a plan view. For example, when the planar shape of the plasma processing chamber 10 of the plasma processing apparatus 1 is centrally asymmetric, the center positions of the plurality of annular grooves 220 in the plan view may be different. In the illustrated example, the annular grooves 220a to 220c of the first annular groove group G1 and the annular grooves 220d to 220f of the second annular groove group G2 have different planar shapes, and the center positions in the plan view are different. However, any or all of the annular grooves 220a to 220h may have different planar shapes.

Figure 19:
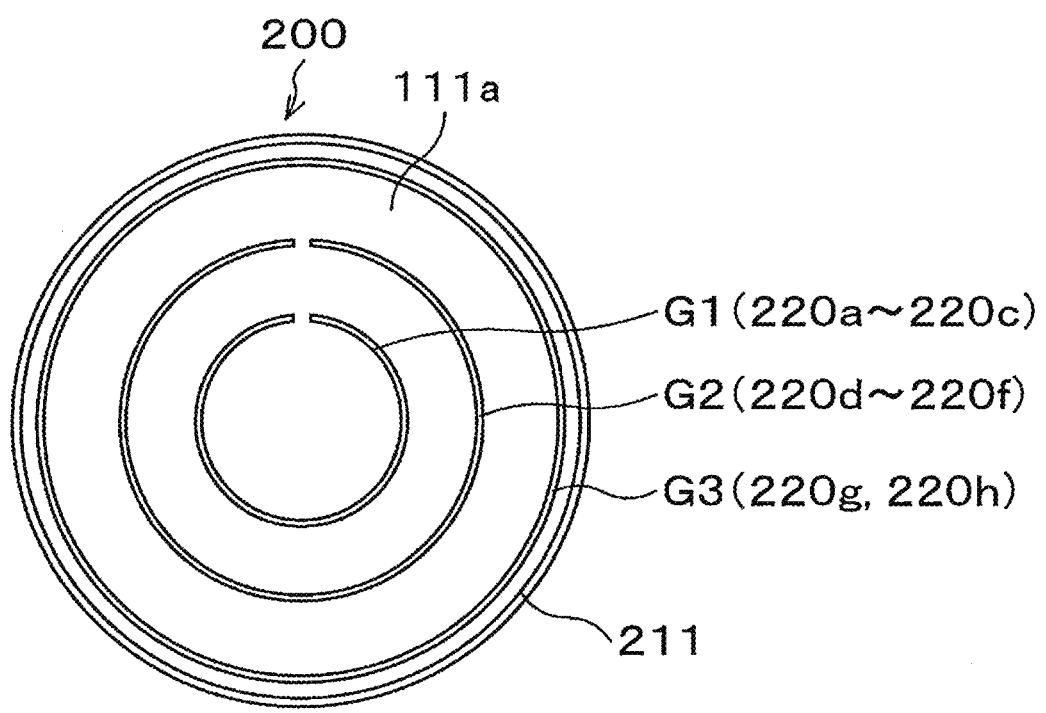
FIG. 19 is a plan view schematically illustrating the configuration of an annular groove according to another embodiment.
Figure 20:
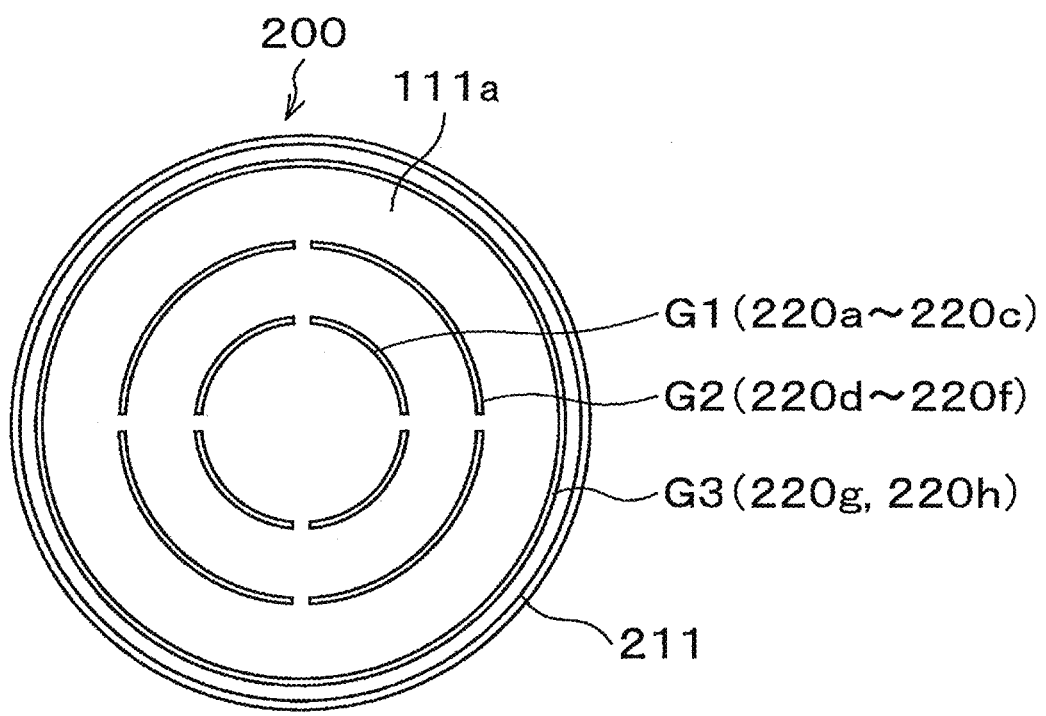
FIG. 20 is a plan view schematically illustrating the configuration of an annular groove according to another embodiment.

As illustrated in FIGS. 19 and 20, the annular groove 220 may be partially discontinuous. In this connection, as illustrated in FIG. 19, one portion may be discontinuous, or as illustrated in FIG. 20, a plurality of portions, for example, four portions may be discontinuous. As long as the annular grooves 220 are formed in an annular shape as a whole, the effect of the annular grooves 220 described above may be enjoyed. In the illustrated example, the annular grooves 220a to 220c of the first annular groove group G1 and the annular grooves 220d to 220f of the second annular groove group G2 were discontinuous, but any or all of the annular grooves 220a to 220h may be discontinuous.

Further, as illustrated in FIG. 20, the annular grooves 220a to 220c of the first annular groove group G1 and the annular grooves 220d to 220f of the second annular groove group G2 are each divided into a plurality of groove segments in the circumferential direction. The first inner annular groove 220a has a plurality of first inner groove segments divided in the circumferential direction, the first intermediate annular groove 220b has a plurality of first intermediate groove segments divided in the circumferential direction, and the first outer annular groove 220c has a plurality of first outer groove segments divided in the circumferential direction. The first heat transfer gas supply path 231a communicates with a plurality of first intermediate groove segments, respectively. The second inner annular groove 220d has a plurality of second inner groove segments divided in the circumferential direction, the second intermediate annular groove 220e has a plurality of second intermediate groove segments divided in the circumferential direction, and the second outer annular groove 220f has a plurality of second outer groove segments divided in the circumferential direction. The second heat transfer gas supply hole 230b communicates with the plurality of second intermediate groove segments, respectively. In addition, in the illustrated example, the annular grooves 220a to 220f are each divided into four segments, but the number of segments is not limited thereto.

As described above, the annular shape of the annular grooves 220 in the present disclosure includes other annular shapes in addition to a circular annular shape. Further, the annular shape of the annular grooves 220 in the present disclosure does not have to be continuous, and may have any annular shape as a whole. In any case, the effect of the annular grooves 220 described above, that is, the effect of controlling the pressure in the heat transfer space of the regions R1 to R3 may be shown.

Figure 21:
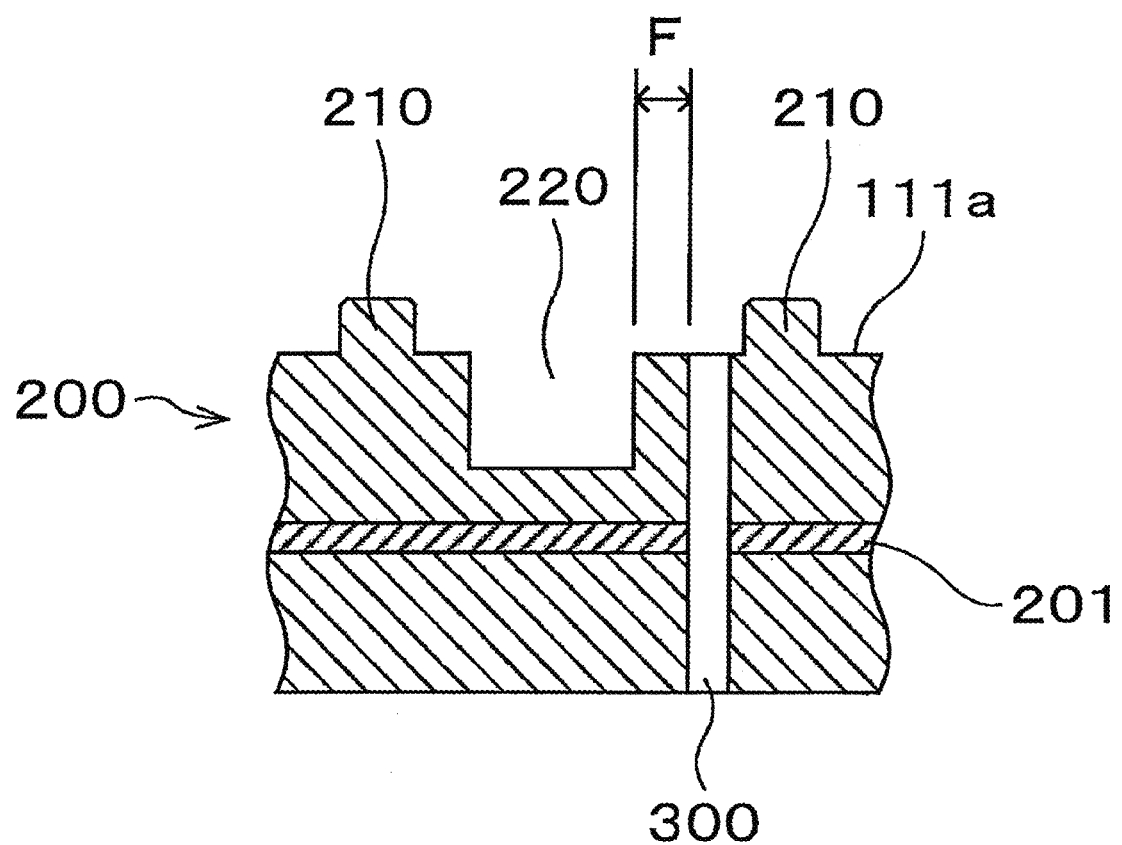
FIG. 21 is a longitudinal sectional view schematically illustrating the configuration in the periphery of an annular groove according to another embodiment.
Figure 22:
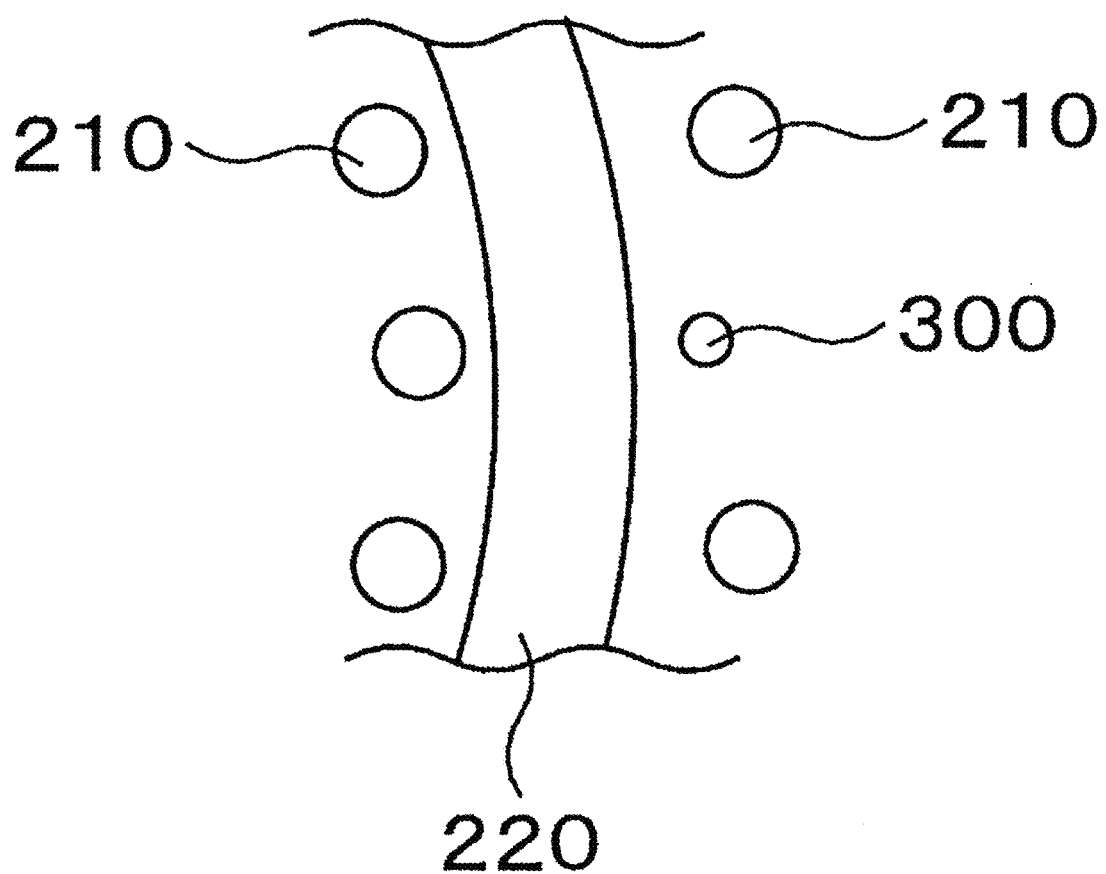
FIG. 22 is a plan view schematically illustrating the configuration in the periphery of an annular groove according to another embodiment.

In the above embodiment, the heat transfer gas supply hole 230 is provided so as to penetrate the chuck body portion 200 from the bottom portion of the annular groove 220, but as illustrated in FIGS. 21 and 22, the heat transfer gas supply hole 300 may be provided outside but in the vicinity of the annular groove 220. In addition, the term "vicinity" as used herein means that, for example, the distance F between the side surface of the heat transfer gas supply hole 300 and the side surface of the annular groove 220 is 10 mm or less.

The heat transfer gas supply hole 300 is provided so as to penetrate the chuck body portion 200 from the substrate support surface 111a. A heat transfer gas supply path (not shown) is connected to the heat transfer gas supply hole 300, and the heat transfer gas supply path communicates with a heat transfer gas supply source (not shown). In addition, the heat transfer gas supplied from the heat transfer gas supply source is supplied to the heat transfer space through the heat transfer gas supply path and the heat transfer gas supply hole 300, flows into the adjacent annular groove 220, and diffuses in the circumferential direction along the annular groove 220. As described above, the heat transfer gas supply holes 300 of the present embodiment also achieve the same effect as the heat transfer gas supply holes 230 of the above embodiment, and may enjoy the same effect as that of the above embodiment.

Figure 23:
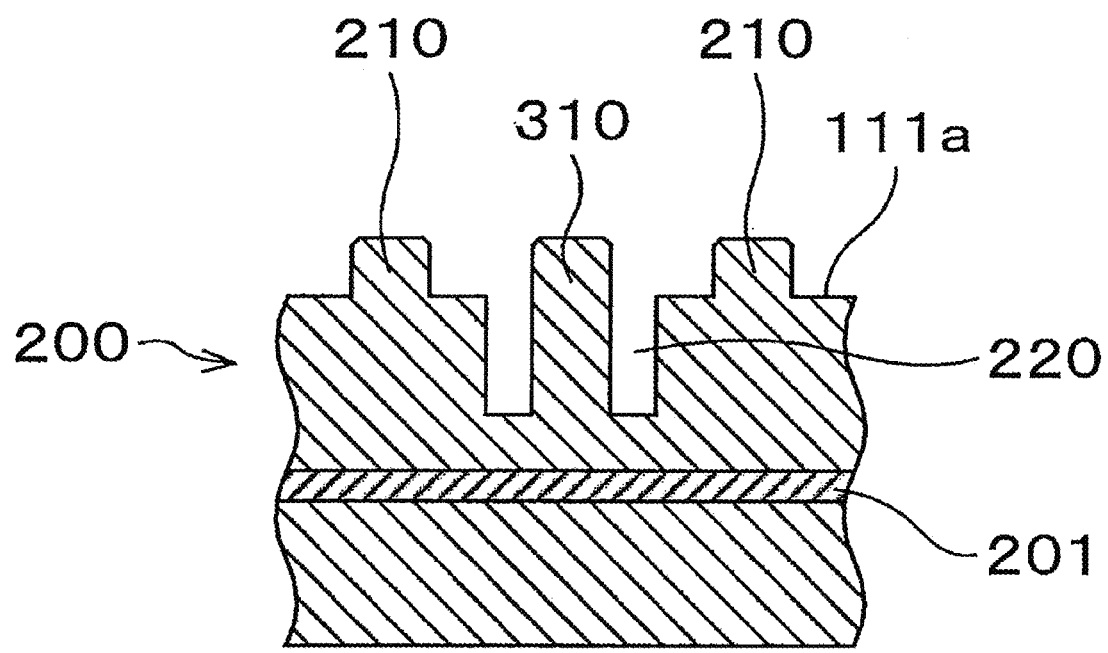
FIG. 23 is a longitudinal sectional view schematically illustrating the configuration in the periphery of an annular groove according to another embodiment.
Figure 24:
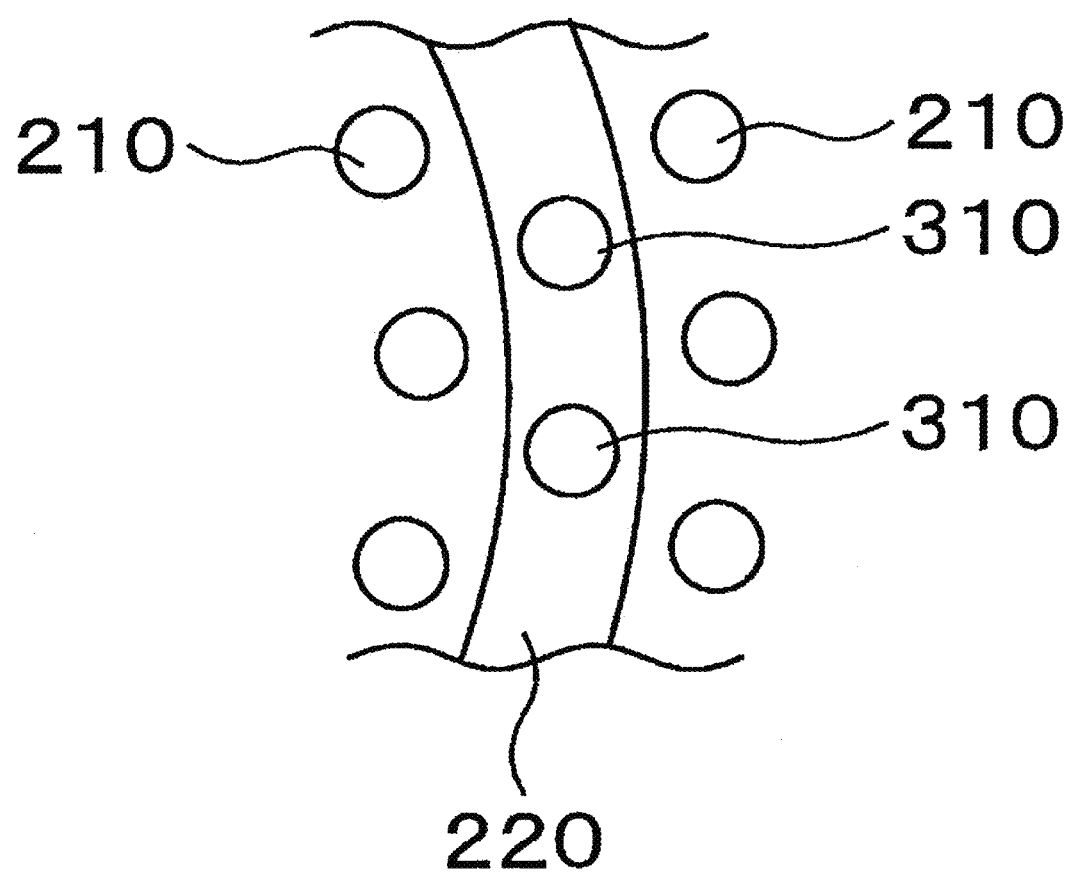
FIG. 24 is a plan view schematically illustrating the configuration in the periphery of an annular groove according to another embodiment.

In the above embodiment, the substrate contact portion 210 is provided outside of the annular groove 220, but as illustrated in FIGS. 23 and 24, the substrate contact portion 310 may be provided so as to project from the bottom portion of the annular groove 220. The substrate contact portion 310 is a dot having a cylindrical shape and comes into contact with the substrate W when the substrate W is supported by the substrate support surface 111a. Further, the substrate contact portion 310 is formed so that the heat transfer gas flows along the annular groove 220 even when the substrate contact portion 310 is provided inside the annular groove 220. In such a case, the same effect as that of the above embodiment may be achieved.

In the above embodiment, the plasma processing apparatus 1 may have a lifter pin (not shown) for raising and lowering the substrate W with respect to the substrate support 11. The lifter pin is provided to be inserted into the substrate support 11.

Figure 25:
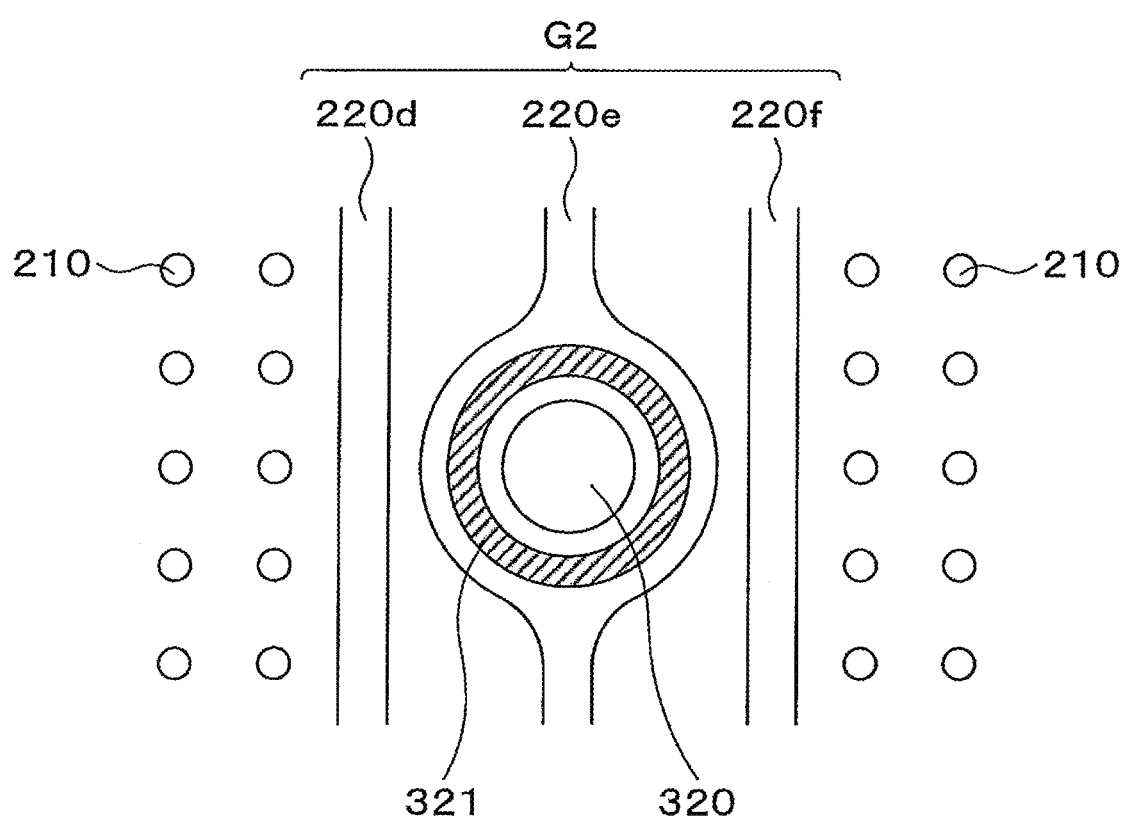
FIG. 25 is a plan view schematically illustrating the configuration in the periphery of an annular groove according to another embodiment.
Figure 26:
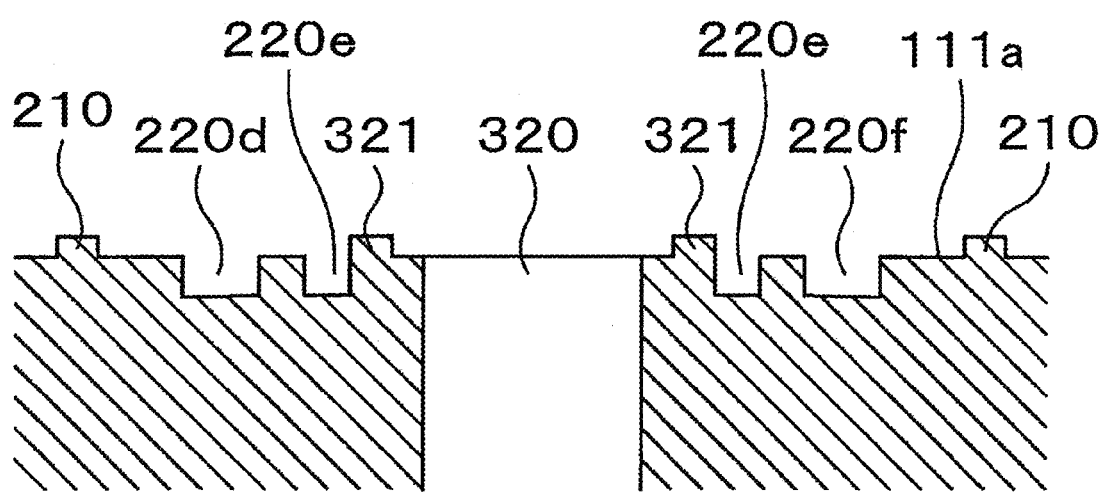
FIG. 26 is a longitudinal sectional view schematically illustrating the configuration in the periphery of an annular groove according to another embodiment.

In such a case, as illustrated in FIGS. 25 and 26, the chuck body portion 200 is provided with a through hole 320 through which the lifter pin is inserted. Further, the through hole 320 may be provided on a circle which is concentric with the annular groove 220, and in the example illustrated in FIGS. 25 and 26, the through hole 320 is provided, for example, through the chuck body portion 200 inside the second intermediate annular groove 220e of the second annular groove group G2.

The inside of the through hole 320 may be evacuated as a countermeasure against abnormal discharge. In such a case, a seal band 321 is provided around the through hole 320, and the seal band 321 comes into contact with the substrate W when the substrate W is supported by the substrate support surface 111a. When the seal band 321 comes into contact with the substrate W in this way, the inside of the through hole 320 is depressurized.

The second intermediate annular groove 220e is provided so as to surround the through hole 320 and the seal band 321. Specifically, the second intermediate annular groove 220e is provided so as to branch off the outside of the through hole 320 and the seal band 321. Even in such a case, the heat transfer gas flows along the second intermediate annular groove 220e and diffuses in the circumferential direction. Accordingly, the same effect as that of the above embodiment may be enjoyed.

In the above embodiment, the substrate support surface 111a is divided into four regions R1 to R4 by the three annular groove groups G1 to G3, but a portion of the groove structure (annular grooves 220a to 220h) may be formed using a seal band structure. That is, the substrate support surface 111a may be divided into a plurality of regions by the groove structure and the seal band structure.

Figure 27:
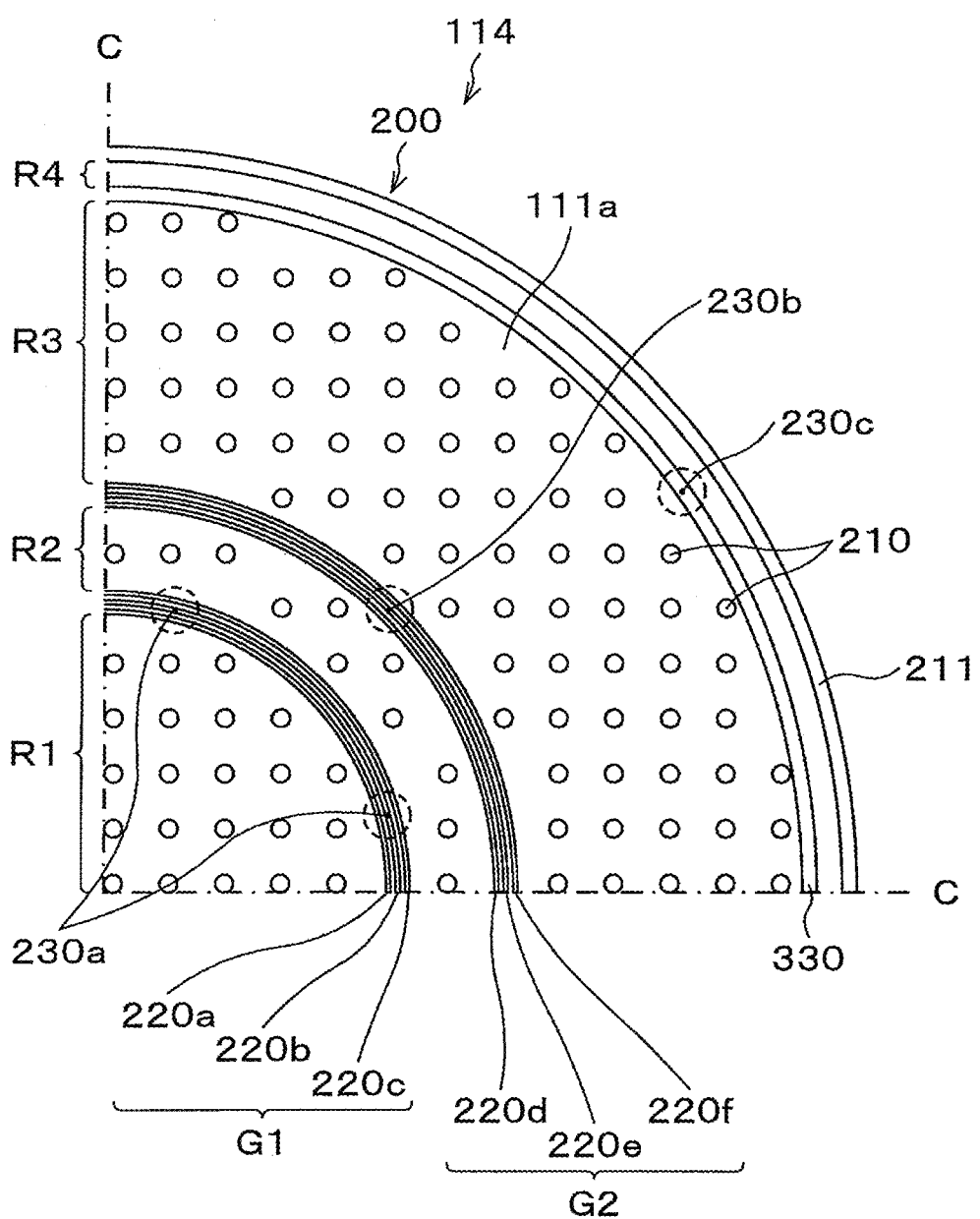
FIG. 27 is a plan view schematically illustrating a partial configuration of an electrostatic chuck according to another embodiment.

For example, as illustrated in FIG. 27, the substrate support surface 111a is provided with a projection portion 330 in place of the third annular groove group G3 of the above embodiment. The projection portion 330 projects from the substrate support surface 111a and is provided in an annular shape. The upper surface of the projection portion 330 is formed to be flat and at the same height as the upper surface of the plurality of substrate contact portions 210, and comes into contact with the substrate W when the substrate W is supported by the substrate support surface 111a.

In such a case, the substrate support surface 111a is divided into four regions R1 to R4 by the two annular groove groups G1 and G2 and the projection portion 330. That is, the third region R3 is an annular region between the second annular groove group G2 and the projection portion 330, and the fourth region R4 is an annular region between the projection portion 330 and the outer peripheral contact portion 211.

As described above, the pressures in the heat transfer spaces of the regions R1 to R3 divided by the two annular groove groups G1 and G2 change gradually, and the temperature of the substrate W also changes gradually in the radial direction. On the other hand, the pressures in the heat transfer spaces of the regions R3 to R4 partitioned by the projection portion 330 change abruptly at the boundary (projection portion 330), and the temperatures of the substrate W also change abruptly. As described above, when it is desired to control the temperature change of the substrate W for each region, it is useful to use a groove structure and a seal band structure together.

In addition, although the projection portion 330 is provided in place of the third annular groove group G3 in the present embodiment, the installation place of the projection portion 330 is not limited thereto. The projection portion 330 may be set to any position according to the temperature control of the substrate W.

In the above embodiment, the number of the substrate contact portions 210 per unit area may vary for each region R1 to R3. By adjusting the number of the substrate contact portions 210 per unit area, the contact rate between the substrate contact portion 210 and the substrate W (="contact area"/"total area in the region") may be adjusted. As a result, the heat transfer coefficient with the substrate W may be adjusted. For example, when the number of the substrate contact portions 210 in the third region R3 per unit area is larger than that in the first region R1 and the second region R2, the heat transfer coefficient with the substrate W in the third region R3 becomes large, and the temperature of the substrate W may be lowered. In this way, by adjusting the number of the substrate contact portions 210 per unit area for each of the regions R1 to R3, the temperature controllability of the substrate W may be further improved.

The embodiments described herein should be considered to be illustrative and not restrictive in all respects. The above embodiments may be omitted, replaced or modified in various forms without departing from the scope of the appended claims and their gist.

The invention claimed is:

1. A substrate processing apparatus, comprising:
   a chamber;
   a substrate support which is arranged in the chamber and has at least one first gas supply path; and
   at least one control valve configured to control a flow rate or pressure of gas supplied through the at least one first gas supply path, wherein:
   the substrate support includes a base, and an electrostatic chuck which is arranged on the base and has an upper surface;
   the upper surface has a plurality of protrusions and a first annular groove group;
   the first annular groove group comprises a first inner annular groove, a first intermediate annular groove, and a first outer annular groove; and
   any one of the first inner annular groove, the first intermediate annular groove, and the first outer annular groove communicates with the at least one first gas supply path;
   wherein the substrate support further has at least one second gas supply path;
   the upper surface of the electrostatic chuck further has a second annular groove group surrounding the first annular groove group;
   the second annular groove group comprises a second inner annular groove, a second intermediate annular groove, and a second outer annular groove;
   any one of the second inner annular groove, the second intermediate annular groove, and the second outer annular groove communicates with the at least one second gas supply path; and
   the at least one control valve is configured to control a flow rate or pressure of gas supplied through the at least one first gas supply path and the at least one second gas supply path; and
   the substrate support further has at least one third gas supply path;
   the upper surface of the electrostatic chuck further has a third annular groove group surrounding the second annular groove group;
   the third annular groove group comprises a third inner annular groove and a third outer annular groove;
   any one of the third inner annular groove and the third outer annular groove communicates with the at least one third gas supply path; and the at least one control valve is configured to control a flow rate or pressure of gas supplied through the at least one first gas supply path, the at least one second gas supply path, and the at least one third gas supply path.

2. The substrate processing apparatus of claim 1, wherein the at least one control valve comprises:
a first control valve configured to independently control a flow rate or pressure of gas supplied through the at least one first gas supply path; and
a second control valve configured to independently control a flow rate or pressure of gas supplied through the at least one second gas supply path.

3. The substrate processing apparatus of claim 1, wherein the at least one control valve comprises:
a first control valve configured to independently control a flow rate or pressure of gas supplied through the at least one first gas supply path;
a second control valve configured to independently control a flow rate or pressure of gas supplied through the at least one second gas supply path; and
a third control valve configured to independently control a flow rate or pressure of gas supplied through the at least one third gas supply path.

4. The substrate processing apparatus of claim 1, wherein the first annular groove group, the second annular groove group, and the third annular groove group have a circular shape.

5. The substrate processing apparatus of claim 1, wherein the first annular groove group and the second annular groove group have a polygonal shape.

6. The substrate processing apparatus of claim 1, wherein the first annular groove group and the second annular groove group have a centrally asymmetrical shape.

7. The substrate processing apparatus of claim 1, wherein:
the first inner annular groove has a plurality of first inner groove segments divided in a circumferential direction;
the first intermediate annular groove has a plurality of first intermediate groove segments divided in a circumferential direction;
the first outer annular groove has a plurality of first outer groove segments divided in a circumferential direction; and
the at least one first gas supply path comprises a plurality of first gas supply paths respectively communicating with the plurality of first intermediate groove segments.

8. The substrate processing apparatus of claim 1, wherein:
the second inner annular groove has a plurality of second inner groove segments divided in a circumferential direction;
the second intermediate annular groove has a plurality of second intermediate groove segments divided in a circumferential direction;
the second outer annular groove has a plurality of second outer groove segments divided in a circumferential direction; and
the at least one second gas supply path comprises a plurality of second gas supply paths respectively communicating with the plurality of second intermediate groove segments.

9. An electrostatic chuck, comprising:
a chuck body portion with an upper surface and at least one first gas supply path, wherein:
the upper surface has a plurality of protrusions and a first annular groove group;
the first annular groove group comprises a first inner annular groove, a first intermediate annular groove, and a first outer annular groove; and
any one of the first inner annular groove, the first intermediate annular groove, and the first outer annular groove communicates with the at least one first gas supply path;
wherein the chuck body portion further has at least one second gas supply path;
the upper surface of the chuck body portion further has a second annular groove group surrounding the first annular groove group;
the second annular groove group comprises a second inner annular groove, a second intermediate annular groove, and a second outer annular groove; and
any one of the second inner annular groove, the second intermediate annular groove, and the second outer annular groove communicates with the at least one second gas supply path; and
wherein the chuck body portion further has at least one third gas supply path;
the upper surface of the chuck body portion further has a third annular groove group surrounding the second annular groove group;
the third annular groove group comprises a third inner annular groove and a third outer annular groove; and
any one of the third inner annular groove and the third outer annular groove communicates with the at least one third gas supply path.

10. The electrostatic chuck of claim 9, wherein the first annular groove group, the second annular groove group, and the third annular groove group have a circular shape.

11. The electrostatic chuck of claim 9, wherein the first annular groove group and the second annular groove group have a polygonal shape.

12. The electrostatic chuck of claim 9, wherein the first annular groove group and the second annular groove group have a centrally asymmetrical shape.

13. The electrostatic chuck of claim 8, wherein:
the first inner annular groove has a plurality of first inner groove segments divided in a circumferential direction;
the first intermediate annular groove has a plurality of first intermediate groove segments divided in a circumferential direction;
the first outer annular groove has a plurality of first outer groove segments divided in a circumferential direction; and
the at least one first gas supply path comprises a plurality of first gas supply paths respectively communicating with the plurality of first intermediate groove segments.

14. The electrostatic chuck of claim 8, wherein:
the second inner annular groove has a plurality of second inner groove segments divided in a circumferential direction;
the second intermediate annular groove has a plurality of second intermediate groove segments divided in a circumferential direction;
the second outer annular groove has a plurality of second outer groove segments divided in a circumferential direction; and
the at least one second gas supply path comprises a plurality of second gas supply paths respectively communicating with the plurality of second intermediate groove segments.

* * * * *